United States Patent
Watts et al.

(10) Patent No.: US 9,412,787 B2
(45) Date of Patent: Aug. 9, 2016

(54) METHOD AND SYSTEM FOR PROVIDING MAGNETIC TUNNELING JUNCTION ELEMENTS HAVING IMPROVED PERFORMANCE THROUGH CAPPING LAYER INDUCED PERPENDICULAR ANISOTROPY AND MEMORIES USING SUCH MAGNETIC ELEMENTS

(71) Applicant: Samsung Electronics Co., LTD., Gyeonggi-do (KR)

(72) Inventors: Steven M. Watts, Mountain View, CA (US); Zhitao Diao, Fremont, CA (US); Xueti Tang, San Jose, CA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 160 days.

(21) Appl. No.: 14/176,310

(22) Filed: Feb. 10, 2014

(65) Prior Publication Data
US 2014/0151829 A1 Jun. 5, 2014

Related U.S. Application Data

(60) Division of application No. 12/776,331, filed on May 7, 2010, now abandoned, which is a continuation-in-part of application No. 12/538,489, filed on Aug. 10, 2009, now Pat. No. 8,913,350.

(51) Int. Cl.
*H01L 27/22* (2006.01)
*B82Y 25/00* (2011.01)
*B82Y 40/00* (2011.01)
*G01R 33/09* (2006.01)
*G11C 11/16* (2006.01)
*H01F 10/32* (2006.01)
*H01F 41/30* (2006.01)
*H01L 43/08* (2006.01)
*H01L 43/12* (2006.01)
*H01F 41/34* (2006.01)

(52) U.S. Cl.
CPC ............. *H01L 27/224* (2013.01); *B82Y 25/00* (2013.01); *B82Y 40/00* (2013.01); *G01R 33/098* (2013.01); *G11C 11/16* (2013.01); *H01F 10/3254* (2013.01); *H01F 10/3286* (2013.01); *H01F 41/307* (2013.01); *H01L 43/08* (2013.01); *H01L 43/12* (2013.01); *H01F 41/34* (2013.01); *H01L 27/228* (2013.01)

(58) Field of Classification Search
CPC ........ B81Y 25/00; B82Y 40/00; B82Y 25/00; G01R 33/098; G01R 33/98; G11C 11/16; H01L 27/224
See application file for complete search history.

(56) References Cited

U.S. PATENT DOCUMENTS 7,269,059 B2 * 9/2007 Morise .................. B82Y 25/00 257/E27.005
7,859,349 B2 * 12/2010 Eyckmans ............. B82Y 25/00 257/421

(Continued)

*Primary Examiner* — Yosef Gebreyesus
(74) *Attorney, Agent, or Firm* — Convergent Law Group LLP

(57) ABSTRACT

A magnetic element and a magnetic memory utilizing the magnetic element are described. A contact is electrically coupled to the magnetic element. The magnetic element includes pinned, nonmagnetic spacer, and free layers and a perpendicular capping layer adjoining the free layer and the contact. The free layer has an out-of-plane demagnetization energy and a perpendicular magnetic anisotropy corresponding to a perpendicular anisotropy energy that is less than the out-of-plane demagnetization energy. The nonmagnetic spacer layer is between the pinned and free layers. The perpendicular capping layer induces at least part of the perpendicular magnetic anisotropy. The free layer is switchable between magnetic states when a write current is passed through the magnetic element. The free layer includes ferromagnetic layers interleaved with capping layer(s) such that a ferromagnetic layer resides at an edge of the free layer. The capping layer(s) are configured such that the ferromagnetic layers are ferromagnetically coupled.

20 Claims, 11 Drawing Sheets

(56) References Cited

U.S. PATENT DOCUMENTS

| | | | |
|---|---|---|---|
| 8,289,663 B2* | 10/2012 | Zhang | B82Y 10/00 360/324.2 |
| 2005/0254286 A1* | 11/2005 | Valet | H01L 43/08 365/158 |
| 2006/0104110 A1* | 5/2006 | Sun | G11C 11/16 365/173 |
| 2007/0188945 A1* | 8/2007 | Fuji | B82Y 25/00 360/324.12 |
| 2007/0247764 A1 | 10/2007 | Lee | |
| 2009/0080123 A1* | 3/2009 | Uehara | B82Y 10/00 360/324.11 |
| 2009/0246557 A1* | 10/2009 | Horng | G01R 33/098 428/811.1 |
| 2010/0090261 A1* | 4/2010 | Zheng | G11C 11/16 257/295 |
| 2012/0155153 A1* | 6/2012 | Shukh | G11C 11/16 365/158 |

\* cited by examiner

METHOD AND SYSTEM FOR PROVIDING MAGNETIC TUNNELING JUNCTION ELEMENTS HAVING IMPROVED PERFORMANCE THROUGH CAPPING LAYER INDUCED PERPENDICULAR ANISOTROPY AND MEMORIES USING SUCH MAGNETIC ELEMENTS

CROSS-REFERENCE TO RELATED APPLICATIONS

The present application is a divisional of co-pending patent application Ser. No. 12/776,331, filed May 7, 2010, entitled "Method and System for Providing Magnetic Tunneling Junction Elements Having Improved Performance Through Capping Layer Induced Perpendicular Anisotropy and Memories Using Such Magnetic Elements", assigned to the assignee of the present application and which is a continuation-in-part of co-pending patent application Ser. No. 12/538,489, filed Aug. 10, 2009, entitled "Method and System for Providing Magnetic Tunneling Junction Elements Having Improved Performance Through Capping Layer Induced Perpendicular Anisotropy and Memories Using Such Magnetic Elements", and assigned to the assignee of the present application.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-RAM). STT-RAM utilizes magnetic elements written at least in part by a current driven through the magnetic element.

For example, FIG. 1 depicts a conventional magnetic tunneling junction (MTJ) 10 as it may be used in a conventional STT-RAM. The conventional MTJ 10 typically resides on a bottom contact 11, uses conventional seed layer(s) 12 and includes a conventional antiferromagnetic (AFM) layer 14, a conventional pinned layer 16, a conventional tunneling barrier layer 18, a conventional free layer 20, and a conventional capping layer 22. Also shown is top contact 24.

Conventional contacts 11 and 24 are used in driving the current in a current-perpendicular-to-plane (CPP) direction, or along the z-axis as shown in FIG. 1. The conventional tunneling barrier layer 18 is nonmagnetic and is, for example, a thin insulator such as MgO. The conventional seed layer(s) 12 are typically utilized to aid in the growth of subsequent layers, such as the AFM layer 14, having a desired crystal structure. Direct exposure of the conventional free layer 20 to the top contact 24 may result in a disordered interface, dead magnetic regions and enhanced damping. Consequently, the conventional capping layer 22 is provided directly on the free layer 20, prior to deposition of the top contact 24. This conventional cap acts as a diffusion block and improves the surface quality of the conventional free layer 24. The conventional capping layer 22 is typically made of materials such as Ta.

The conventional pinned layer 16 and the conventional free layer 20 are magnetic. The magnetization 17 of the conventional pinned layer 16 is fixed, or pinned, in a particular direction, typically by an exchange-bias interaction with the AFM layer 14. Although depicted as a simple (single) layer, the conventional pinned layer 16 may include multiple layers. For example, the conventional pinned layer 16 may be a synthetic antiferromagnetic (SAF) layer including magnetic layers antiferromagnetically or ferromagnetically coupled through thin conductive layers, such as Ru. In such a SAF, multiple magnetic layers interleaved with a thin layer of Ru may be used. Further, other versions of the conventional MTJ 10 might include an additional pinned layer (not shown) separated from the free layer 20 by an additional nonmagnetic barrier or conductive layer (not shown).

The conventional free layer 20 has a changeable magnetization 21. Although depicted as a simple layer, the conventional free layer 20 may also include multiple layers. For example, the conventional free layer 20 may be a synthetic layer including magnetic layers antiferromagnetically or ferromagnetically coupled through thin conductive layers, such as Ru.

Spin transfer torque may be used to write to the conventional MTJ 10. In particular, spin transfer torque rotates the magnetization 21 of the conventional free layer 20 to one of the two directions along its easy axis. When a write current is passed through the conventional MTJ 10 perpendicular to the plane of the layers, electrons may be spin polarized by transmission through or reflection from the conventional pinned layer 16. The spin transfer torque on the magnetization 21 of the conventional free layer 20 may be adequate to switch the conventional free layer 20 if a sufficient current is driven through the conventional MTJ 10. Therefore, the conventional free layer 20 may be written to the desired state. The conventional MTJ 10 may thus be used for data storage in an STT-RAM.

The conventional MTJ 10 is required to be thermally stable for use in STT-RAM. During periods of latency, when the conventional MTJ 10 is preserving a previously stored datum, the magnetization 21 of the conventional free layer 20 is not completely static. Instead, thermal fluctuations allow the magnetic moments within the conventional free layer 20 to oscillate and/or precess. The random nature of these fluctuations translates to the occurrence of generally rare, unusually large fluctuations. These fluctuations may result in the reversal of the magnetization 21 of the conventional free layer 20, making the conventional MTJ 10 unstable. The probability of such a reversal decreases with increases in the height of the energy barrier between the two stable orientations (along the x-axis as shown in FIG. 1) of the free layer magnetization 21. Thus, for a memory employing the conventional MTJ 10 to be thermally stable, the conventional MTJ 10 should have a sufficiently high energy barrier that the magnetization 21 of the conventional free layer 20 is not switched by such thermal fluctuations. This energy barrier is typically achieved through a magnetic anisotropy energy sufficient to retain the magnetization 21 in the direction it was written. This magnetic anisotropy of the free layer 20 is generally large, in plane and along a particular axis. For example, in the conventional MTJ 10 shown in FIG. 1, the anisotropy would be along a horizontal (easy) axis, allowing the free layer magnetization 21 to be stable when the magnetization 21 is stable along the x-axis in FIG. 1.

Although a large energy barrier is desired for thermal stability, a large energy barrier may adversely affect writeability of the conventional MTJ. In general, a larger energy barrier provided by the in plane, generally uniaxial anisotropy results in a larger switching current. A larger write current would be driven through the conventional MTJ to switch the magnetization 21 of the conventional free layer 20. Use of a larger write current is generally undesirable for a variety of reasons including, but not limited to, increased heat generated and the potential need for a larger transistor in a magnetic memory cell. Thus, thermal stability may be considered to be at odds with a reduced write current.

Accordingly, what is needed is a method and system that may improve the thermal stability of the spin transfer torque based memories. The method and system address such a need.

BRIEF SUMMARY OF THE INVENTION

The exemplary embodiments provide methods and systems for providing a magnetic element and a magnetic memory utilizing the magnetic element. The magnetic element is used in a magnetic device, such as a magnetic memory, that includes a contact electrically coupled to the magnetic element. The method and system include providing pinned, nonmagnetic spacer, and free layers. The free layer has an out-of plane demagnetization energy and a perpendicular magnetic anisotropy corresponding to a perpendicular anisotropy energy. The perpendicular anisotropy energy is less than the out-of-plane demagnetization energy. The nonmagnetic spacer layer is between the pinned and free layers. The method and system also include providing a perpendicular capping layer adjoining the free layer and the contact. The perpendicular capping layer is for inducing at least part of the perpendicular magnetic anisotropy in the free layer. The magnetic element is configured to allow the free layer to be switched between a plurality of stable magnetic states when a write current is passed through the magnetic element.

DETAILED DESCRIPTION OF THE INVENTION

Figure 1:
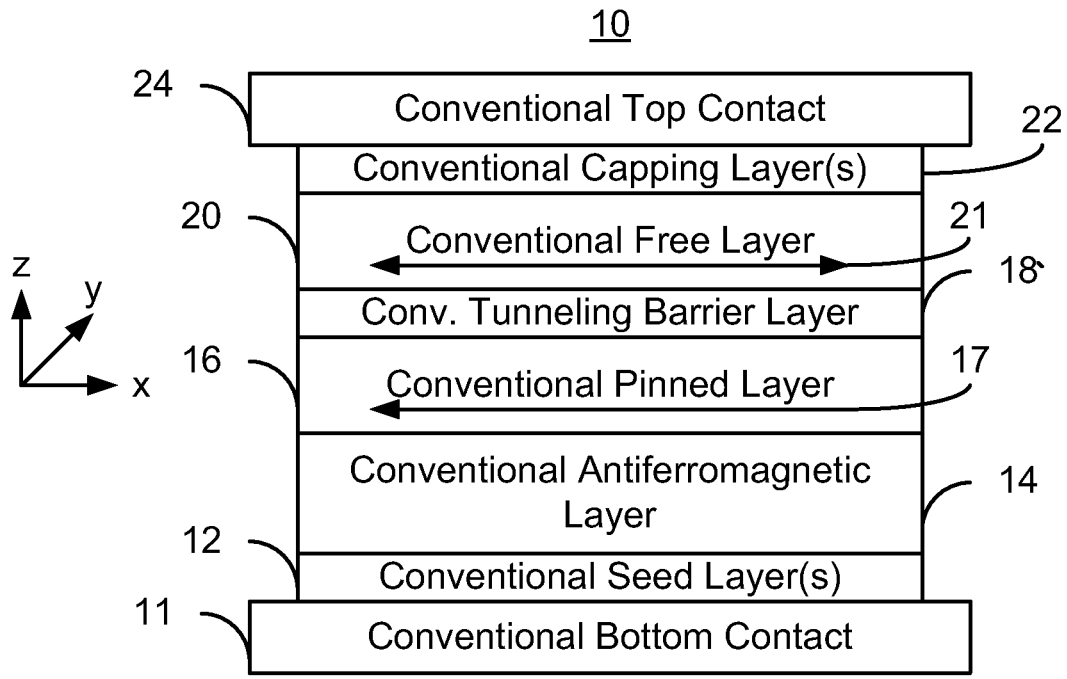
FIG. 1 depicts a conventional magnetic element.

The exemplary embodiments relate to magnetic elements usable in magnetic devices, such as magnetic memories, and the devices using such magnetic elements. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

Methods and systems for providing a magnetic element and a magnetic memory utilizing the magnetic element are described. The magnetic element is used in a magnetic device, such as a magnetic memory, that includes a contact electrically coupled to the magnetic element. The method and system include providing pinned, nonmagnetic spacer, and free layers. The free layer has an out-of-plane demagnetization energy and a perpendicular magnetic anisotropy corresponding to a perpendicular anisotropy energy that is less than the out-of-plane demagnetization energy. The nonmagnetic spacer layer is between the pinned and free layers. The method and system also include providing a perpendicular capping layer adjoining the free layer and the contact. The perpendicular capping layer is for inducing the perpendicular magnetic anisotropy in the free layer. The magnetic element is configured to allow the free layer to be switched between a plurality of stable magnetic states when a write current is passed through the magnetic element.

The exemplary embodiments are described in the context of particular magnetic elements and magnetic memories having certain components. One of ordinary skill in the art will readily recognize that the present invention is consistent with the use of magnetic elements and magnetic memories having other and/or additional components and/or other features not inconsistent with the present invention. The method and system are also described in the context of current understanding of the spin transfer phenomenon. Consequently, one of ordinary skill in the art will readily recognize that theoretical explanations of the behavior of the method and system are made based upon this current understanding of spin transfer. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic elements having particular layers. However, one of ordinary skill in the art will readily recognize that magnetic elements having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single elements. However, one of ordinary skill in the art will readily recognize that the method and system are consistent with the use of magnetic memories having multiple elements. Further, as used herein, "in-plane" is substantially within or parallel to the plane of one or more of the layers of a magnetic element. Conversely, "perpendicular" corresponds to a direction that is substantially perpendicular to one or more of the layers of the magnetic element.

Figure 2:
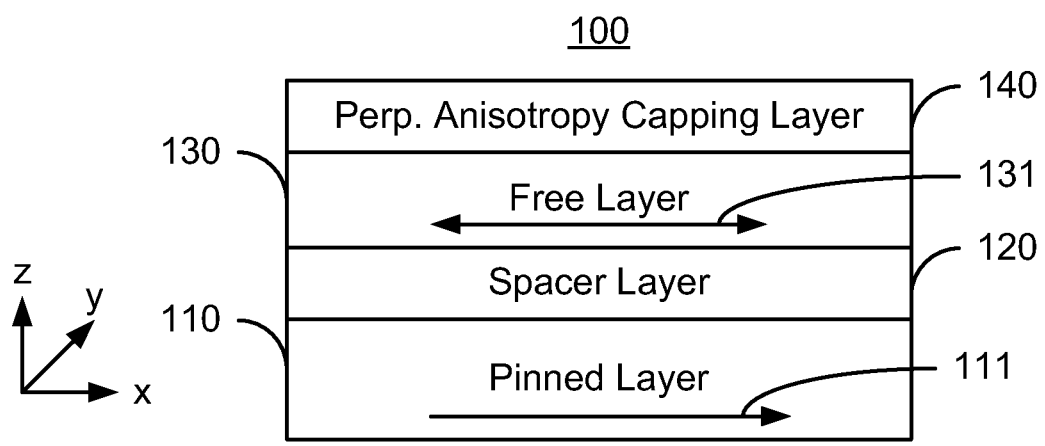
FIG. 2 depicts an exemplary of a magnetic element having improved thermal stability.

FIG. 2 depicts an exemplary of a magnetic element 100 having improved thermal stability. The magnetic element 100 is for use in a magnetic device, such as a magnetic memory, in which current is to be driven through the magnetic element 100. Consequently, such a device may include contacts (not shown in FIG. 2) through which current would be provided to and exit from the magnetic element 100. For clarity, FIG. 2 is not drawn to scale and some portions of the magnetic element 100 might be omitted. The magnetic element 100 includes a pinned layer 110, a spacer layer 120, free layer 130, and a perpendicular capping layer 140. The magnetic element 100 may also include seed layer(s) (not shown). In addition, the magnetic element 100 generally also includes a pinning structure, such as an AFM layer (not shown), which is used to fix, or pin, the magnetization of the pinned layer 110 in a desired direction.

The pinned layer 110 and the free layer 130 are magnetic and thus may include one or more of Ni, Fe, and Co, particularly in an alloy form. The magnetization 111 of the pinned layer 110 is fixed, or pinned, in a particular direction, typically by an exchange-bias interaction with an AFM layer (not shown). Although depicted as a simple layer with a single magnetization 111, the pinned layer 110 may include multiple layers. For example, the pinned layer 110 may be a SAF including magnetic layers antiferromagnetically or ferromagnetically coupled through thin layers, such as Ru. In such a SAF, multiple magnetic layers interleaved with thin layer(s) of Ru or other material may be used.

The spacer layer 120 is nonmagnetic. In some embodiments, the spacer layer 120 is an insulator, for example a tunneling barrier. In such embodiments, the spacer layer 120 may include crystalline MgO, which may enhance the tunneling magnetoresistance (TMR) of the magnetic element. In alternate embodiments, the spacer layer 120 might have another structure, for example a granular layer including conductive channels in an insulating matrix.

The free layer 130 has a changeable magnetization 131. Although depicted as a simple layer with a single magnetization 131, the free layer 130 may also include multiple ferromagnetic and/or nonmagnetic layers. For example, the free layer 130 may be a SAF including magnetic layers antiferromagnetically or ferromagnetically coupled through one or more thin layers, such as Ru. The free layer 130 may also be a bilayer. Similarly, the free layer 130 might be a trilayer. In addition, the bilayer and/or trilayer might be repeated in the free layer 130. Other structures for the free layer 130 may also be used. For example, the free layer might include multiple ferromagnetic layers interleaved with one or more capping layer. In this embodiment, the capping layer would be so termed because it resides on a ferromagnetic layer within the free layer 130. A ferromagnetic layer would reside at the top and bottom edges of the free layer 130. Thus, the free layer would include at least two ferromagnetic layers with a capping layer in between.

In the embodiment shown, the free layer has an easy axis along the magnetization 131 shown. The free layer easy axis is, therefore, along the x-axis, in the plane of the free layer 130. The magnetization of the free layer 130 is stable along the easy axis, to the left or to the right in FIG. 2. Thus, the stable magnetic states are those in which the magnetization 131 of the free layer is to the left or right in FIG. 2. Further, the free layer 130 has an out-of-plane demagnetization energy and a perpendicular magnetic anisotropy corresponding to a perpendicular anisotropy energy. In the embodiment shown, the in-plane magnetic anisotropy is substantially parallel to x-y plane of FIG. 2, while the perpendicular magnetic anisotropy is substantially parallel to the z-axis. The perpendicular anisotropy energy that is less than the out-of-plane demagnetization energy for the free layer 130. As a result, the magnetization 131 of the free layer 130 is stable in-plane. The magnetic element 100 is also configured to allow the free layer 130 to be switched between stable magnetic states when a write current is passed through the magnetic element 100. Thus, in the exemplary embodiment depicted in FIG. 2, spin transfer torque may be used to switch the magnetization 131 of the free layer 130 to be parallel or antiparallel to the magnetization 111 of the pinned layer 110.

The perpendicular capping layer 140 is adjacent to the free layer 130. In some embodiments, the perpendicular capping layer 140 adjoins the free layer 130 and a contact (not shown in FIG. 2). The perpendicular capping layer 140 is so named because the perpendicular capping layer 140 is configured to induce at least a portion of the perpendicular magnetic anisotropy in the free layer 130. In some embodiments, the perpendicular capping layer 140 induces the perpendicular magnetic anisotropy substantially without changing the out-of-plane demagnetization energy or the in-plane magnetic anisotropy of the free layer 130. The perpendicular capping layer 140 induces a component of the perpendicular magnetic anisotropy in the free layer 130 throughout use: both during operation and during latency when the magnetic element 100 is in a quiescent state.

The perpendicular capping layer 140 may contribute to the perpendicular magnetic anisotropy of the free layer 130 based on the materials selected. In some embodiments, the perpendicular capping layer 140 is an oxide or nitride such as MgO, NiO, aluminum oxide, silicon oxide, AlN, SiN, TaN, TiN, $RuO_2$ or ITO (indium tin oxide). The oxide or nitride perpendicular capping layer may be doped and/or have a stoichiometry that may reduce the layer's resistance. For example, MgO doped with Ti may be used as the perpendicular capping layer 140. In other embodiments, the perpendicular capping layer 140 is a metal such as Al, Cu, Mg, Ru, Au, Cr, Pt, Pd, Ta, W, or V. However, in such embodiments interdiffusion with the free layer and/or increased damping may need to be considered. The materials used for the perpendicular capping layer 140 may thus include one or more of MgO, doped MgO, NiO, aluminum oxide, silicon oxide, AlN, SiN, TaN, TiN, $RuO_2$, ITO, Al, Cu, Mg, Ru, Au, Cr, Pt, Pd, Ta, W, and/or V. In some embodiments, the perpendicular capping layer 140 may be a multilayer. For example, the perpendicular capping layer 140 may be a bilayer having an oxide or nitride layer adjoining the free layer and a metallic layer on the oxide or nitride layer. In one such embodiment, the oxide layer includes MgO and the metallic layer includes Mg. Use of such a bilayer as the perpendicular capping layer 140 may allow use of thinner insulators while providing effective diffusion blocking. In some embodiments of this bilayer the metallic layer may include materials that increase the perpendicular anisotropy of the free layer via stress, such as Ru, Cu, Pt, Pd, Ta, and/or W. In some such embodiments, the additional metallic layer may include materials used to improve spin transfer torque or reduce the overall resistance of the bilayer, for example Al, Au, Mg, and/or Cr. In other embodiments, the perpendicular capping layer 140 may be a trilayer including the materials described above.

In addition to inducing a perpendicular anisotropy in the free layer 130, the perpendicular capping layer 140 may reduce dead magnetic regions, improve the order of the interface, and reduce damping that may otherwise adversely affect performance of the free layer 130. The perpendicular capping layer 140 may also act as a diffusion block and improve the surface quality of the free layer. Further, in some embodiments, the perpendicular capping layer 140 may improve damping by diffusion blocking and a reduction in the spin pump effect. More specifically, because the perpendicular capping layer 140 resides between the free layer 130 and a contact (not shown), the effects of the contact adjoining the free layer 130 may be mitigated or eliminated.

The magnetic element 100 may also include other components not shown in FIG. 2. For example, in addition to seed layers, the magnetic element 100 may include an AFM layer (not shown) adjoining the pinned layer 110 for pinning the magnetization 111 of the pinned layer 110. The magnetic element 100 might include an additional free layer residing between the free layer and the nonmagnetic spacer layer and an additional capping layer residing on the additional free layer and between the additional free layer and the free layer 130. The additional capping layer is configured such that the free layer 130 and the additional free layer (not shown) are antiferromagnetically dipole coupled.

The magnetic element 100 may have improved performance and thermal stability. The perpendicular capping layer 140 is interposed between the free layer 130 and a contact (not shown in FIG. 2). As a result, the perpendicular cap layer 140 may function as a diffusion blocking layer, which improves the interface, reduces or eliminated dead magnetic regions of the free layer 130, and mitigates damping. In addition, when doped materials, such as doped MgO or a bilayer/trilayer such as MgO/Mg are used, the resistance of the perpendicular capping layer 140 is reduced, which may be desirable. Further, the magnetic element 100 may have improved thermal stability due to the perpendicular capping layer 140. More specifically, the perpendicular capping layer 140 increases the perpendicular magnetic anisotropy of the free layer 130. This increase in perpendicular magnetic anisotropy leads to a decrease in the switching current $J_{co}$, without degradation of the thermal stability. This phenomenon may be understood by noting that the switching current density $J_{co}$, in certain limiting cases, may be considered proportional to an "effective moment" $m_{eff}$. This effective moment is used in the expression $4\pi m_{eff}$ which describes the net effect of the actual demagnetizing field $4\pi m_s$ and any perpendicular anisotropy that may be present in the free layer 130. The perpendicular anisotropy contributed by the presence of the perpendicular capping layer 140 decreases $m_{eff}$. Consequently, the switching current density $J_{co}$ and the required write current decrease. On the other hand, the stability of the free layer 130 is limited by thermal fluctuations that are in-plane. The perpendicular anisotropy induced by the perpendicular capping layer 140 does not affect the in-plane behavior of the free layer 130. Thus, the write current may be decreased while the thermal stability maintained. Stated differently, for a given write current, the magnetic element 100 has improved thermal stability. As a result, the magnetic element 100 is less subject to thermal fluctuations and thermal stability may be increased. The magnetic element 100 may thus be more suitable for applications such as STT-RAM. In addition to limiting inter-diffusion and inducing a perpendicular anisotropy as discuss above, in some embodiments, the capping layer 140 may also transmit spin transfer torque between magnetic layers and allow magnetic coupling between layers. In such embodiments, additional configurations of magnetic layers and spin transfer switching may be improved.

Figure 3:
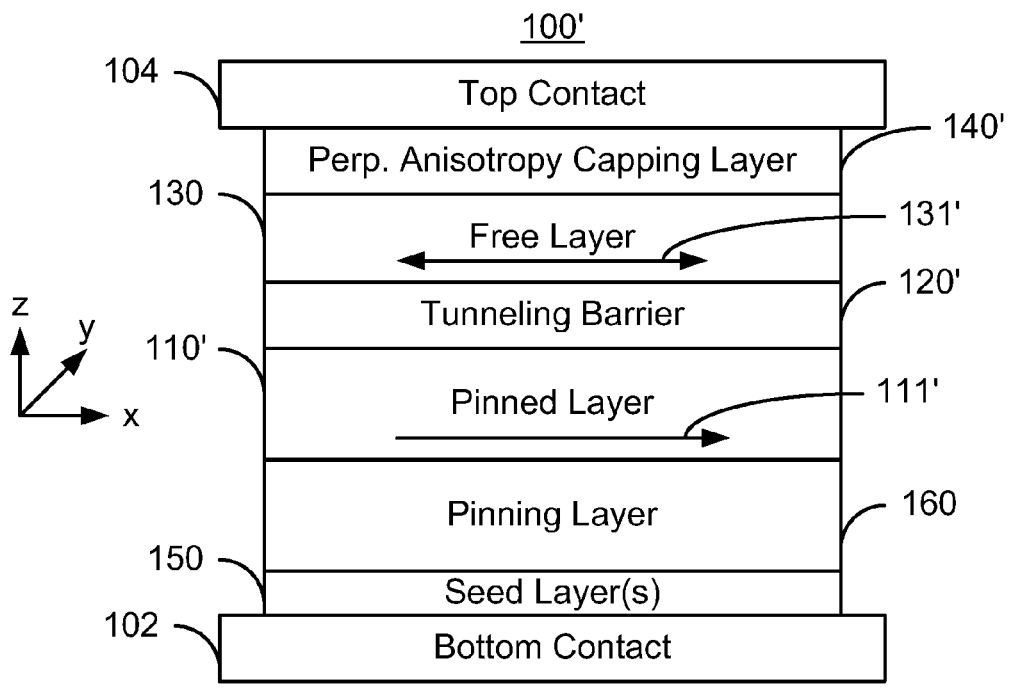
FIG. 3 depicts another exemplary of a magnetic element having improved thermal stability.

FIG. 3 depicts another exemplary of a magnetic element 100' having improved thermal stability. The magnetic element 100' is for use in a magnetic device, such as a magnetic memory, in which current is to be driven through the magnetic element 100'. Consequently, contacts 102 and 104 through which current would be provided to and exit from the magnetic element 100' are shown in FIG. 3. For clarity, FIG. 3 is not drawn to scale and some portions of the magnetic element 100' might be omitted. Further, the magnetic element 100' is analogous to the magnetic element 100 depicted in FIG. 2. Thus, the magnetic element 100' includes a pinned layer 110', a spacer layer 120', a free layer 130', and a perpendicular capping layer 140' that are analogous to the pinned layer 110, the spacer layer 120, the free layer 130, and the perpendicular capping layer 140, respectively. The magnetic element 100 may also include seed layer(s) 150 and pinning layer 160. The seed layer(s) 150 are used to provide the desired surface for growth of the pinning layer 160. In some embodiments, the pinning layer 160 is an AFM, such as IrMn.

The pinned layer 110' and the free layer 130' are magnetic and thus may include one or more of Ni, Fe, and Co, particularly in an alloy form. For simplicity, the pinned layer 110' is shown as having a magnetization 111' and the free layer 130' is shown with magnetization/easy axis 131'. The structure and function of the pinned layer 110' and free layer 130' are analogous to that of the pinned layer 110 and free layer 130, respectively. Thus, the pinned layer 110' and free layer 130' may be SAFs, other multilayers or have other structures. The magnetic element 100' may also include other components not shown in FIG. 3. For example, The magnetic element 100' might include an additional free layer residing between the free layer and the nonmagnetic spacer layer and an additional capping layer residing on the additional free layer and between the additional free layer and the free layer 130'. The additional capping layer is configured such that the free layer 130' and the additional free layer (not shown) are antiferromagnetically dipole coupled.

The free layer 130' has an in-plane magnetic anisotropy, an out-of-plane demagnetization energy, and a perpendicular magnetic anisotropy. The perpendicular magnetic anisotropy corresponds to a perpendicular magnetic energy. In the embodiment shown, the in-plane magnetic anisotropy is substantially parallel to x-y plane of FIG. 3, while the perpendicular magnetic anisotropy is substantially parallel to the z-axis. The out-of-plane demagnetization energy is also greater than the perpendicular anisotropy energy for the free layer 130'. As a result, the magnetization 131' of the free layer 130' is stable in-plane. The magnetic element 100' is also configured to allow the free layer 130' to be switched between stable magnetic states when a write current is passed through the magnetic element 100'. Thus, in the exemplary embodiment depicted in FIG. 3, spin transfer torque may be used to switch the magnetization 131' of the free layer 130'.

In the embodiment shown, the spacer layer 120' is a tunneling barrier layer 120'. In one such embodiment, the tunneling barrier layer 120' may include crystalline MgO, which may enhance the tunneling magnetoresistance (TMR) of the magnetic element 100'.

The perpendicular capping layer 140' adjoins the free layer 130' and the top contact 104. The perpendicular capping layer 140' is configured to induce at least a portion of the perpendicular magnetic anisotropy in the free layer 130'. In the embodiment shown, the perpendicular capping layer 140' induces the perpendicular magnetic anisotropy without substantially changing the in-plane magnetic anisotropy of the free layer 130'. The perpendicular capping layer 140' induces a component of the perpendicular magnetic anisotropy in the free layer 130' throughout use: both during operation and during latency when the magnetic element 100' is in a quiescent state.

The perpendicular capping layer 140' may contribute to the perpendicular anisotropy of the free layer 130' based on the materials selected. These materials are analogous to those used for the perpendicular capping layer 140. The materials used for the perpendicular capping layer 140' may thus include one or more of MgO, doped MgO, NiO, aluminum oxide, silicon oxide, AlN, SiN, TaN, TiN, $RuO_2$, ITO, Al, Cu, Mg, Ru, Au, Cr, Pt, Pd, Ta, W and/or V. In some embodiments, the perpendicular capping layer 140' may be a multilayer. In one such embodiment, the perpendicular capping layer 140' may be a bilayer having an oxide or nitride layer adjoining the free layer and a metallic layer on the oxide or nitride layer. For example, the perpendicular capping layer 140' could include an MgO layer and a metallic layer such as Ru, Mg, or Cr. The perpendicular capping layer 140' may also include a trilayer.

The magnetic element 100' shares the benefits of the magnetic element 100. The magnetic element 100' may have improved performance and thermal stability. The perpendicular capping layer 140' is interposed between the free layer 130' and the contact 104. As a result, the perpendicular cap layer 140' aids in improving the interface, reducing or eliminated dead magnetic regions of the free layer 130', and mitigating damping. In addition, when doped materials, such as doped MgO or a bilayer such as MgO/Mg are used, the resistance of the perpendicular capping layer 140' is reduced, which may be desirable. Further, the magnetic element 100 may have improved thermal stability due to the perpendicular capping layer 140. More specifically, the perpendicular capping layer 140' increases the perpendicular magnetic anisotropy of the free layer 130', which may decrease the write current required substantially without degradation of the thermal stability. As a result, the magnetic element 100' is less subject to thermal fluctuations and thermal stability may be increased. Further, as described above, a reduction in interdiffusion, enhanced spin torque transfer, and desired magnetic coupling may also be achieved. The magnetic element 100' may thus be more suitable for applications such as STT-RAM.

Figure 4:
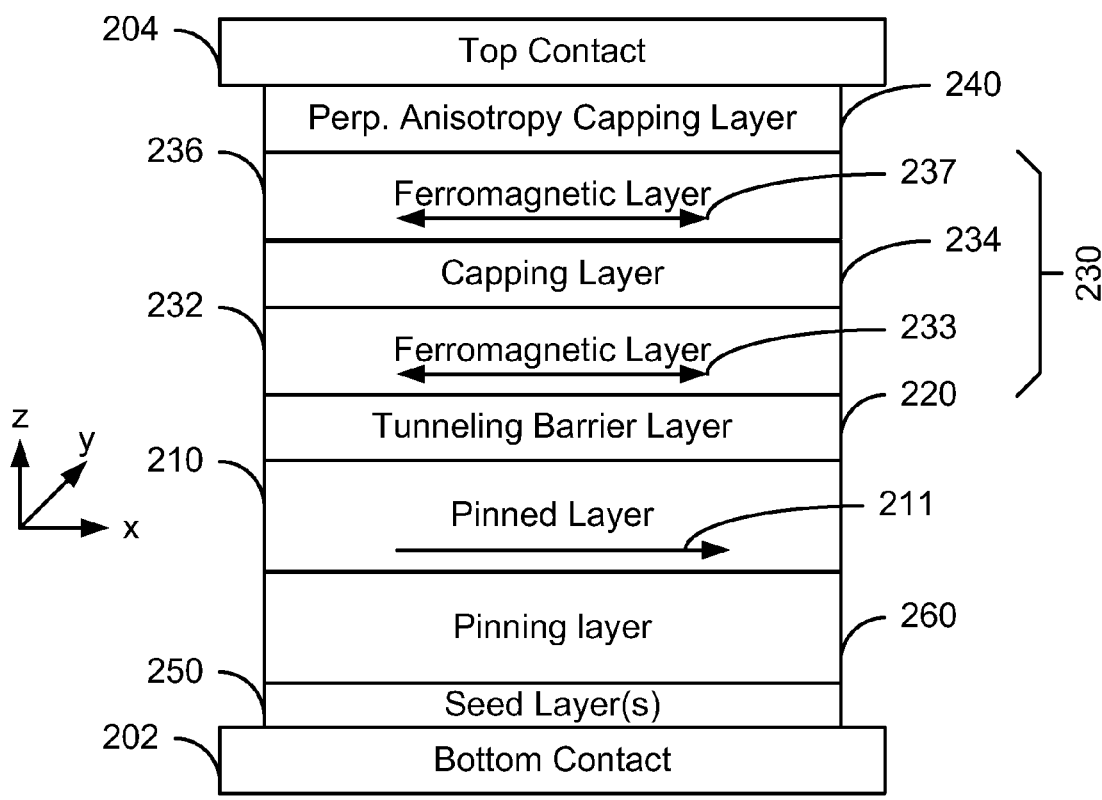
FIG. 4 depicts another exemplary embodiment of a magnetic element having improved thermal stability.

FIG. 4 depicts another exemplary embodiment of a magnetic element 200 having improved thermal stability. The magnetic element 200 is for use in a magnetic device, such as a magnetic memory, in which current is to be driven through the magnetic element 200. Consequently, contacts 202 and 204 through which current would be provided to and exit from the magnetic element 200 are shown in FIG. 4. For clarity, FIG. 4 is not drawn to scale and some portions of the magnetic element 200 might be omitted. Further, the magnetic element 200 is analogous to the magnetic elements 100/100' depicted in FIGS. 2/3. Thus, the magnetic element 200 includes seed layer(s) 250, pinning layer 260, pinned layer 210, spacer layer 220, free layer 230, and perpendicular capping layer 240 that are analogous to the seed layer(s) 150, pinning layer 160, pinned layer 110/110', the spacer layer 120/120', the free layer 130/130', and the perpendicular capping layer 140/140', respectively. The seed layer(s) 250 are used to provide the desired surface for growth of the pinning layer 260. In some embodiments, the pinning layer 260 is an AFM, such as IrMn.

The pinned layer 210 and the free layer 230 are magnetic and thus may include one or more of Ni, Fe, and Co, particularly in an alloy form. For simplicity, the pinned layer 210 is shown as having a magnetization 211. The structure and function of the seed layer(s) 250, pinning layer 260, and pinned layer 210 are analogous to that of the seed layer(s) 150, pinning layer 160, and pinned layer 110/110', respectively. Thus, the pinned layer 210 may be a SAF, other multilayers or have other structures. The magnetic element 200 may also include other components not shown in FIG. 4.

The free layer 230 includes ferromagnetic layers 232 and 236 and capping layer 234. The ferromagnetic layers 232 and 236 have magnetizations 233 and 237, respectively. In the embodiment shown, the capping layer 234 is configured such that the magnetizations 233 and 237 of the ferromagnetic layers 232 and 236, respectively, are ferromagnetically coupled. Thus, the magnetizations 233 and 237 are aligned. In addition, in some embodiments, the capping layer 234 may also affect the perpendicular anisotropy of the ferromagnetic layers 232 and 236 in a way that is similar to the perpendicular capping layers 140 and 140' and the perpendicular anisotropy capping layer 240, described below. Thus, the materials used for the perpendicular capping layer 234 may include one or more of MgO, doped MgO, NiO, aluminum oxide, silicon oxide, AlN, SiN, TaN, TiN, $RuO_2$, ITO, Al, Cu, Mg, Ru, Au, Cr, Pt, Pd, Ta, W and/or V. In this embodiment the perpendicular capping layer 234 is understood to be thin enough to allow either orange-peel ferromagnetic coupling or to mediate ferromagnetic exchange coupling between ferromagnetic layers 232 and 236.

The ferromagnetic layers 232 and 236 of the free layer 230 also have an in-plane magnetic anisotropy, an out-of-plane demagnetization energy, and a perpendicular magnetic anisotropy corresponding to a perpendicular anisotropy energy. In the embodiment shown, the in-plane magnetic anisotropy is substantially parallel to x-y plane of FIG. 4, while the perpendicular magnetic anisotropy is substantially parallel to the z-axis. The out-of-plane demagnetization energy is also greater than the perpendicular anisotropy energy for the ferromagnetic layers 232 and 236 of the free layer 230. As a result, the magnetizations 231 and 237 of the free layer 230 are stable in-plane. The magnetic element 200 is also configured to allow the free layer 230 to be switched between stable magnetic states when a write current is passed through the magnetic element 200. Thus, in the exemplary embodiment depicted in FIG. 4, spin transfer torque may be used to switch the magnetizations 231 and 233 of the free layer 230.

In the embodiment shown, the spacer layer 220 is a tunneling barrier layer 220. In one such embodiment, the tunneling barrier layer 220 may include crystalline MgO, which may enhance the tunneling magnetoresistance (TMR) of the magnetic element 200.

The perpendicular capping layer 240 adjoins the ferromagnetic layer 236 of the free layer 230 and the top contact 204. The perpendicular capping layer 240 is configured to induce at least a portion of the perpendicular magnetic anisotropy in ferromagnetic layer 236 of the free layer 230. In the embodiment shown, the perpendicular capping layer 240 induces the perpendicular magnetic anisotropy substantially without changing the in-plane magnetic anisotropy of the ferromagnetic layer 236 of the free layer 230. The perpendicular capping layer 240 induces a component of the perpendicular magnetic anisotropy in the ferromagnetic layer 236 throughout use: both during operation and during latency when the magnetic element 200 is in a quiescent state.

The perpendicular capping layer 240 may contribute to the perpendicular anisotropy of the free layer 230 based on the materials selected. These materials are analogous to those used for the perpendicular capping layer 140/140'. The materials used for the perpendicular capping layer 240 may thus include one or more of MgO, doped MgO, NiO, aluminum oxide, silicon oxide, AlN, SiN, TaN, TiN, $RuO_2$, ITO, Al, Cu, Mg, Ru, Au, Cr, Pt, Pd, Ta, W and/or V. In some embodiments, the perpendicular capping layer 240 may be a multilayer. In one such embodiment, the perpendicular capping layer 240 may be a bilayer having an oxide or nitride layer adjoining the free layer and a metallic layer on the oxide or nitride layer. For example, the perpendicular capping layer 240 could includes an MgO layer and a metallic layer such as Ru, Mg, or Cr. As discussed above with respect to the perpendicular capping layers 140/140', the perpendicular capping layer 240 may also reduce dead magnetic regions, improve the order of the interface, and reduce damping that may otherwise adversely affect performance of the free layer 230. The perpendicular capping layer 240 may also be a trilayer including the materials described above.

The magnetic element 200 shares the benefits of the magnetic elements 100/100'. The magnetic element 200 may have improved performance and thermal stability. The perpendicular capping layer 240 is interposed between the top ferromagnetic layer 236 of the free layer 230 and the contact 204. As a result, the perpendicular cap layer 240 aids in improving the interface, reducing or eliminated dead magnetic regions of the ferromagnetic layer 236 of the free layer 230, and mitigating damping. In addition, when doped materials, such as doped MgO or a bilayer such as MgO/Mg are used, the resistance of the perpendicular capping layer 240 is reduced, which may be desirable. Further, the magnetic element 200 may have improved thermal stability due to the perpendicular capping layer 240. More specifically, the perpendicular capping layer 240 increases the perpendicular magnetic anisotropy of the ferromagnetic layer 236, which may decrease the write current required substantially without degradation of the thermal stability. Because they are ferromagnetically coupled, the ferromagnetic layer 232 and the ferromagnetic layer 236 tend to switch together. Thus, the switching current of the free layer 230 may be reduced substantially without adversely affecting the thermal stability of the free layer 230. As a result, the magnetic element 200 is less subject to thermal fluctuations and thermal stability may be increased. Further, as described above, a reduction in inter-diffusion, spin transfer torque transmission, and desired magnetic coupling may also be achieved between the layers 232 and 236. The magnetic element 200 may thus be more suitable for applications such as STT-RAM.

Figure 5:
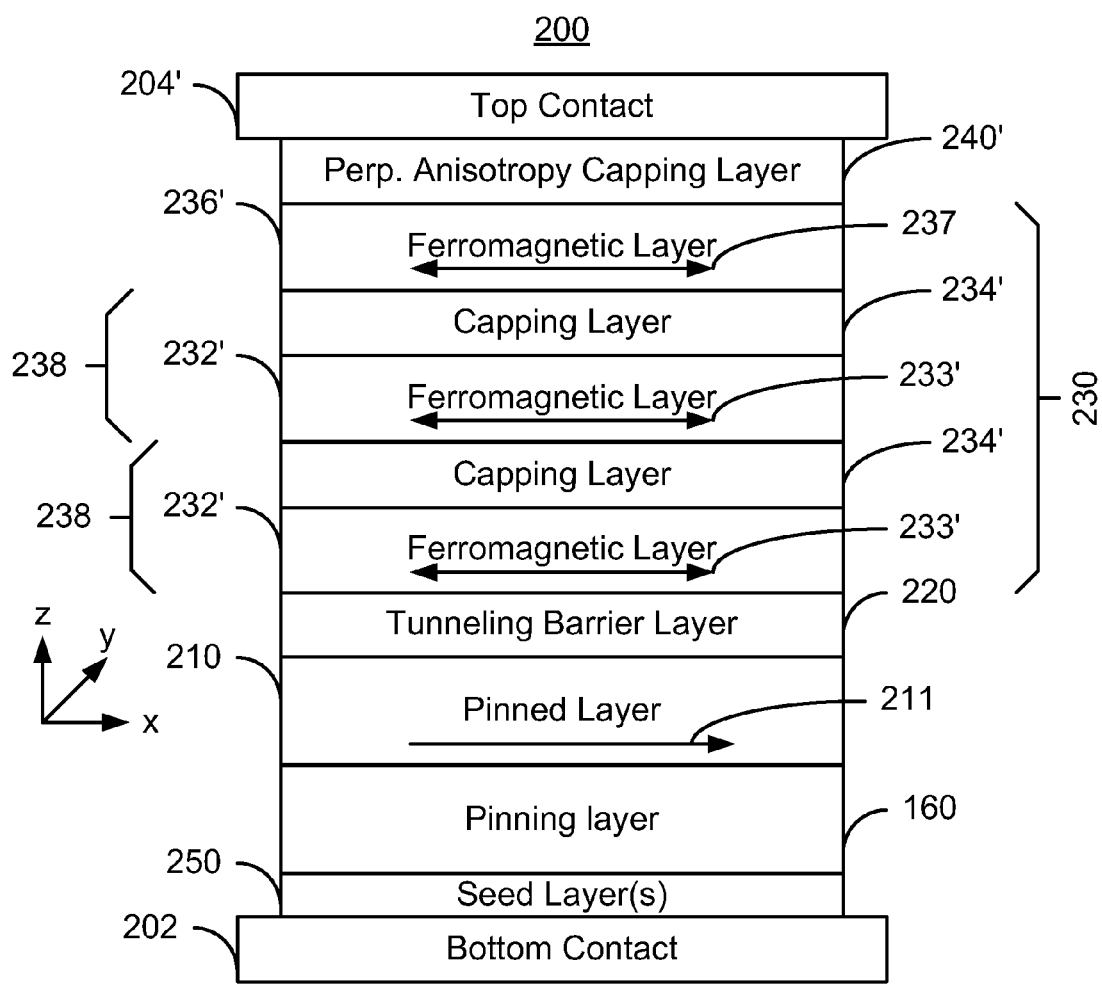
FIG. 5 depicts another exemplary embodiment of a magnetic element having improved thermal stability.

FIG. 5 depicts another exemplary embodiment of a magnetic element 200' having improved thermal stability. The magnetic element 200' is for use in a magnetic device, such as a magnetic memory, in which current is to be driven through the magnetic element 200'. Consequently, contacts 202' and 204' through which current would be provided to and exit from the magnetic element 200' are shown in FIG. 5. For clarity, FIG. 5 is not drawn to scale and some portions of the magnetic element 200' might be omitted. Further, the magnetic element 200' is analogous to the magnetic elements 100/100'/200 depicted in FIGS. 2-4. Thus, the magnetic element 200' includes seed layer(s) 250', pinning layer 260', pinned layer 210', spacer layer 220', free layer 230', and perpendicular capping layer 240' that are analogous to the seed layer(s) 150/250, pinning layer 160/260, pinned layer 110/110'/210, the spacer layer 120/120'/220, the free layer 130/130'/210, and the perpendicular capping layer 140/140'/240, respectively.

The magnetic element 200' is essentially identical to the magnetic element 200. However, the free layer 230' includes multiple repeats of the ferromagnetic layer 232 and capping layer 234 shown in FIG. 4. Referring back to FIG. 5, two repeats of the bilayer 238 are shown. Each bilayer 238 includes a ferromagnetic layer 232' and a capping layer 234'. The two ferromagnetic layers 232' and the ferromagnetic layer 236' are all ferromagnetically coupled. Although two repeats of the bilayer 238 are shown in FIG. 5, another number of repeats might be provided. The capping layer 234' may also increase the perpendicular anisotropy of ferromagnetic layer 232' in a manner analogous to the capping layer 234.

The magnetic element 200' shares the benefits of the magnetic elements 100/100'/200. The magnetic element 200' may have improved performance and thermal stability. The perpendicular capping layer 240' is interposed between the top ferromagnetic layer 236' of the free layer 230' and the contact 204'. As a result, the perpendicular cap layer 240' aids in improving the interface, reducing or eliminated dead magnetic regions of the ferromagnetic layer 236', and mitigating damping. In addition, when doped materials, such as doped MgO or a bilayer such as MgO/Mg are used, the resistance of the perpendicular capping layer 240' is reduced, which may be desirable. Further, the magnetic element 200' may have improved thermal stability due to the perpendicular capping layer 240'. More specifically, the perpendicular capping layer 240' increases the perpendicular magnetic anisotropy of the ferromagnetic layer 236', which may decrease the write current required substantially without degradation of the thermal stability. Thus, the switching current of the free layer 230' may be reduced substantially without adversely affecting the thermal stability of the free layer 230'. As a result, the magnetic element 200' is less subject to thermal fluctuations and thermal stability may be increased. The magnetic element 200' may thus be more suitable for applications such as STT-RAM.

Figure 6:
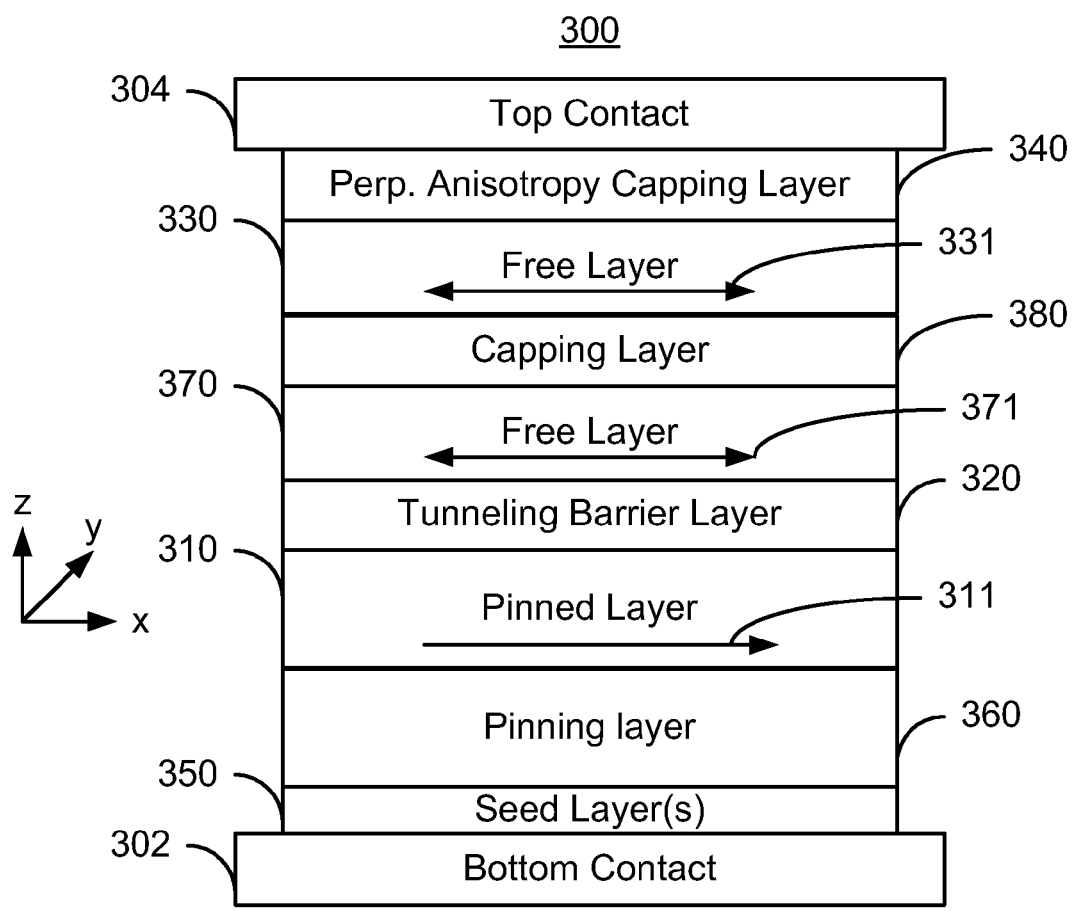
FIG. 6 depicts another exemplary embodiment of a magnetic element having improved thermal stability.

FIG. 6 depicts another exemplary embodiment of a magnetic element 300 having improved thermal stability. The magnetic element 300 is for use in a magnetic device, such as a magnetic memory, in which current is to be driven through the magnetic element 300. Consequently, contacts 302 and 304 through which current would be provided to and exit from the magnetic element 300 are shown in FIG. 6. For clarity, FIG. 6 is not drawn to scale and some portions of the magnetic element 300 might be omitted. Further, the magnetic element 300 is analogous to the magnetic elements 100/100'/200/200' depicted in FIGS. 2-5. Thus, the magnetic element 300 includes seed layer(s) 350, pinning layer 360, pinned layer 310, spacer layer 320, free layer 330, and perpendicular capping layer 340 that are analogous to the seed layer(s) 150/250/250', pinning layer 160/260/260', pinned layer 110/110'/210/210', the spacer layer 120/120'/220/220', the free layer 130/130'/230/230', and the perpendicular capping layer 140/140'/240/240', respectively. The seed layer(s) 350 are used to provide the desired surface for growth of the pinning layer 360. In some embodiments, the pinning layer 360 is an AFM, such as IrMn.

The pinned layer 310 and the free layer 330 are magnetic and thus may include one or more of Ni, Fe, and Co, particularly in an alloy form. For simplicity, the pinned layer 310 is shown as having a magnetization 311. The structure and function of the seed layer(s) 350, pinning layer 360, and pinned layer 310 are analogous to that of the seed layer(s) 150/250/250', pinning layer 160/260/260', and pinned layer 110/110'/210/210', respectively. Thus, the pinned layer 310 may be a SAF, other multilayers or have other structures. The magnetic element 300 may also include other components not shown in FIG. 5.

In the embodiment shown, the spacer layer 320 is a tunneling barrier layer 320. In one such embodiment, the tunneling barrier layer 320 may include crystalline MgO, which may enhance the tunneling magnetoresistance (TMR) of the magnetic element 300.

The free layer 330 is analogous to the free layers 130/130'/230/230'. Although shown as a simple (single) layer, the free layer 230 may include multiple layers. For example, the free layer 330 may be analogous to the free layers 230/230', including multiple ferromagnetically coupled ferromagnetic layers. The free layer 320 is, however, magnetically coupled with the free layer 370, described below.

The magnetic element 300 also includes an additional free layer 370 depicted as having magnetization 371 and an additional capping layer 380. The additional free layer 370 lies between the free layer 330 and the tunneling barrier layer 320. Although shown as a simple layer, the additional free layer 380 may include multiple layers, for example a SAF including multiple ferromagnetic layers (not shown) interleaved with nonmagnetic layers (not shown). The ferromagnetic layers might be ferromagnetically coupled or antiferromagnetically coupled. The additional capping layer 380 resides on the additional free layer 370 and between the additional free layer 370 and the free layer 330. The additional capping layer 380 is configured such that the magnetization 331 of the free layer 330 and the magnetization 371 of the additional free layer 370 are magnetically coupled. In the embodiment shown, the magnetizations 331 and 371 are antiferromagnetically dipole coupled. Further, the capping layer 380 may also affect the perpendicular anisotropy of the ferromagnetic layers 370 and 330 in a way that is similar to the perpendicular capping layers 140, 140', 240, and 240'. The materials used for the perpendicular capping layer 380 may thus include one or more of MgO, doped MgO, NiO, aluminum oxide, silicon oxide, AlN, SiN, TaN, TiN, $RuO_2$, ITO, Al, Cu, Mg, Ru, Au, Cr, Pt, Pd, Ta, W and/or V. In one such embodiment the perpendicular capping layer 380 is thin enough to allow significant antiferromagnetic dipole coupling between ferromagnetic layers 370 and 330.

The free layers 330 and 370 also have an in-plane magnetic anisotropy, an out-of-plane demagnetization energy and a perpendicular magnetic anisotropy corresponding to a perpendicular anisotropy energy. In the embodiment shown, the in-plane magnetic anisotropy is substantially parallel to x-y plane of FIG. 6, while the perpendicular magnetic anisotropy is substantially parallel to the z-axis. The out-of-plane demagnetization energy is also greater than the perpendicular anisotropy energy for the free layers 330 and 370. As a result, the magnetizations 331 and 371 of the free layers 330 and 370 are stable in-plane. The magnetic element 300 is also configured to allow the free layers 330 and 370 to be switched between stable magnetic states when a write current is passed through the magnetic element 300. Thus, in the exemplary embodiment depicted in FIG. 6, spin transfer torque may be used to switch the magnetizations 331 and 371 of the free layers 330 and 370.

The perpendicular capping layer 340 adjoins the free layer 330 and the top contact 304. The perpendicular capping layer 340 is configured to induce at least a portion of the perpendicular magnetic anisotropy in the free layer 330. In the embodiment shown, the perpendicular capping layer 340 induces the perpendicular magnetic anisotropy substantially without changing the in-plane magnetic anisotropy of the free layer 330. The perpendicular capping layer 340 induces a component of the perpendicular magnetic anisotropy in the free layer 330 throughout use: both during operation and during latency when the magnetic element 300 is in a quiescent state.

The perpendicular capping layer 340 may contribute to the perpendicular anisotropy of the free layer 330 based on the materials selected. These materials are analogous to those used for the perpendicular capping layer 140/140'/240/240'. The materials used for the perpendicular capping layer 340 may thus include one or more of MgO, doped MgO, NiO, aluminum oxide, silicon oxide, AlN, SiN, TaN, TiN, $RuO_2$, ITO, Al, Cu, Mg, Ru, Au, Cr, Pt, Pd, Ta, W and/or V. In some embodiments, the perpendicular capping layer 340 may be a multilayer. In one such embodiment, the perpendicular capping layer 340 may be a bilayer having an oxide or nitride layer adjoining the free layer and a metallic layer on the oxide or nitride layer. For example, the perpendicular capping layer 340 could include an MgO layer and a metallic layer such as Ru, Mg, or Cr. As discussed above with respect to the perpendicular capping layers 140/140'/240/240', the perpendicular capping layer 340 may also reduce dead magnetic regions, improve the order of the interface, and reduce damping that may otherwise adversely affect performance of the free layer 330. The perpendicular capping layer 340 may also be a trilayer including the materials described above.

The magnetic element 300 shares the benefits of the magnetic elements 100/100'/200/200'. The magnetic element 300 may have improved performance and thermal stability. The perpendicular capping layer 340 is interposed between the free layer 330 and the contact 304. As a result, the perpendicular cap layer 340 aids in improving the interface, reducing or eliminated dead magnetic regions of the free layer 330, and mitigating damping. In addition, when doped materials, such as doped MgO or a bilayer such as MgO/Mg are used, the resistance of the perpendicular capping layer 340 is reduced, which may be desirable. Further, the magnetic element 300 may have improved thermal stability due to the perpendicular capping layer 340. More specifically, the perpendicular capping layer 340 increases the perpendicular magnetic anisotropy of the free layer 330, which may decrease the write current required substantially without degradation of the thermal stability. Because they are antiferromagnetically coupled, the free layer 330 and the free layer 370 tend to switch together. Thus, the switching current of the free layers 330 and thus 370 may be reduced substantially without adversely affecting the thermal stability of the free layer 330. As a result, the magnetic element 300 is less subject to thermal fluctuations and thermal stability may be increased. The magnetic element 300 may thus be more suitable for applications such as STT-RAM.

Figure 7:
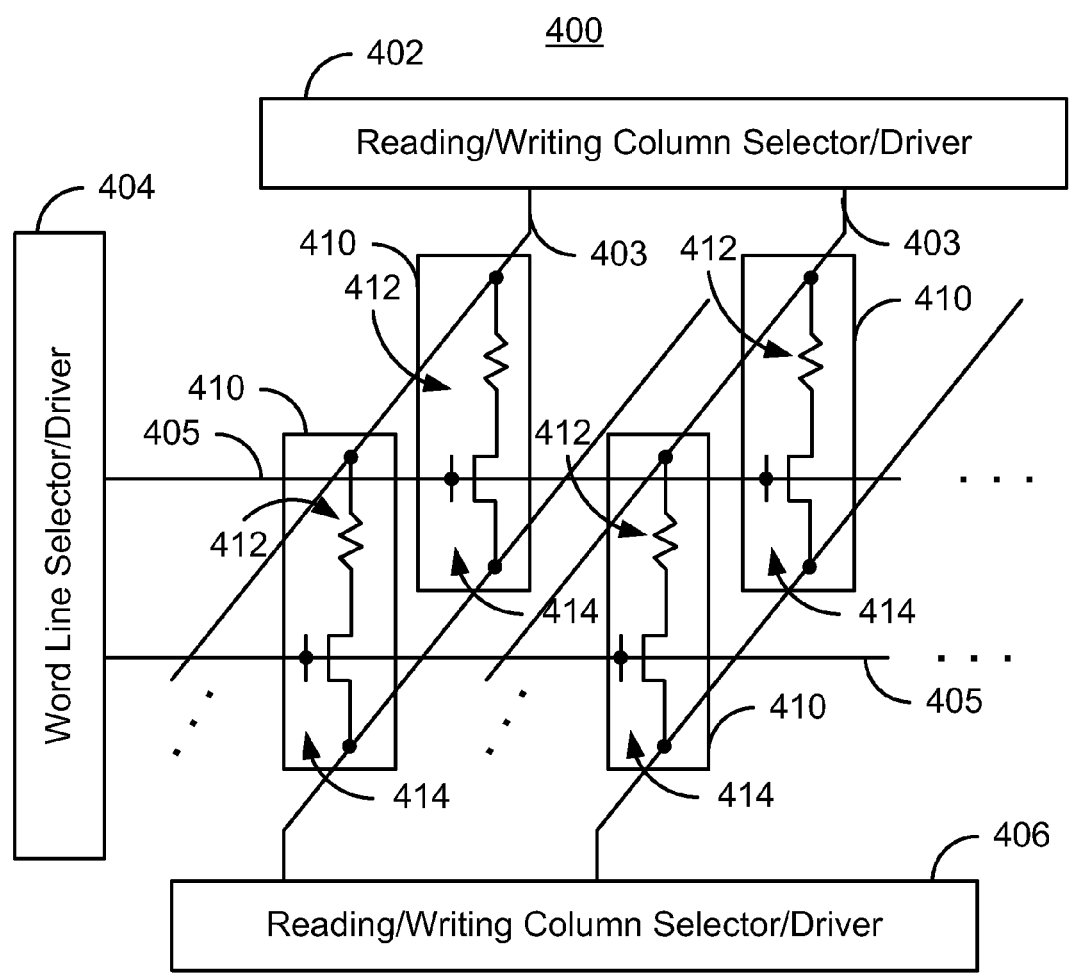
FIG. 7 depicts an exemplary embodiment of a magnetic memory utilizing a magnetic element having improved thermal stability.

FIG. 7 depicts an exemplary embodiment of a portion of a magnetic memory 400 utilizing a magnetic element having improved thermal stability. In the embodiment shown, the magnetic memory is a STT-RAM 400. The STT-RAM 400 includes reading/writing column selector/drivers 402 and 406 as well as word line selector/driver 404. The STT-RAM 400 also includes memory cells 410 including a magnetic element 412 and a selection/isolation device 414. The magnetic element 412 may be any magnetic elements 100/100'/200/200'/300. The reading/writing column selector/drivers 402 and 406 may be used to selectively drive current through the bit lines 403 and thus the cells 410. The word line selector/driver 104 selectively enables row(s) of the STT-RAM 400 by enabling the selection/isolation device 414 coupled with the selected word line 405. In the embodiment shown, the additional magnetic field used in writing may be provided by the bit lines 403.

Because the STT-RAM 400 may use the magnetic elements 100/100'/200/200'/300, the STT-RAM 400 may utilize a lower write current while maintaining the stability of the data stored in memory cells 400. Consequently, performance of the STT-RAM 400 may be improved.

Figure 8:
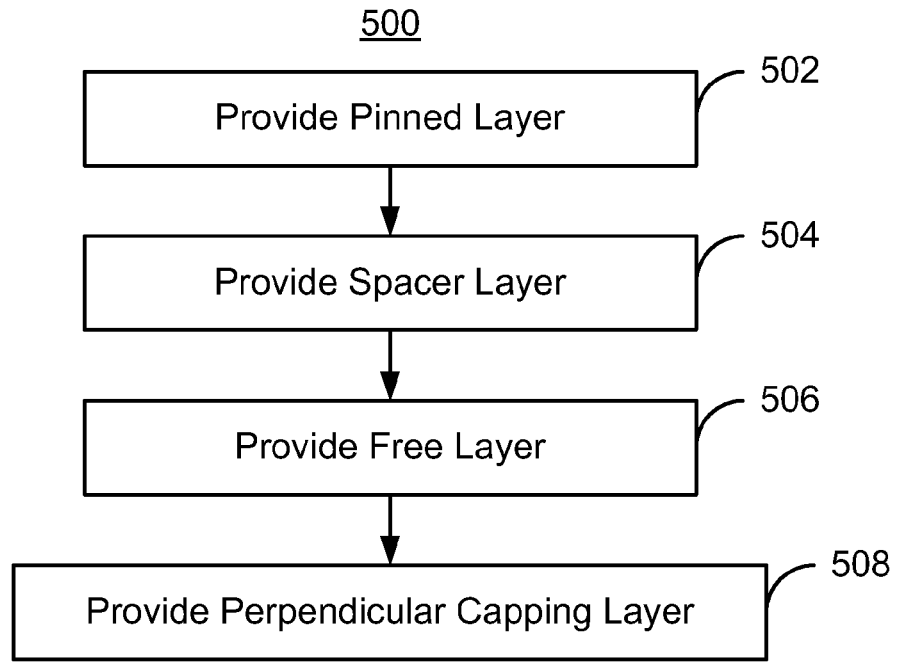
FIG. 8 depicts an exemplary embodiment of a method for fabricating a magnetic element having improved thermal stability.

FIG. 8 depicts an exemplary embodiment of a method 500 for fabricating magnetic element having improved thermal stability. The method 500 is described in the context of the magnetic element 100. However, the method 500 may be used for other magnetic elements including but not limited to the magnetic elements 100', 200, 200', and 300. A pinned layer 110 is provided, via step 502. The spacer layer 120 is provided, via step 504. The free layer 130 is provided, via step 506. In one embodiment, step 506 includes depositing multiple layers, such as for the free layers 200 and 200'. The free layer 130 has an in-plane magnetic anisotropy, an out-of-plane demagnetization energy and a perpendicular magnetic anisotropy that corresponds to a perpendicular anisotropy energy. The out-of-plane demagnetization energy is greater than the perpendicular anisotropy energy.

The method 500 also includes providing the perpendicular pinned layer 140, via step 508. The perpendicular capping layer 130 adjoins the free layer 130 and the contact for the magnetic device of which the magnetic element 100 is a part. The perpendicular capping layer 140 induces at least a portion of the perpendicular magnetic anisotropy in the free layer 130. The magnetic element 100 is configured to allow the free layer 130 to be switched between a plurality of stable magnetic states when a write current is passed through the magnetic element 100. Using the method 500, the magnetic element 100, 100', 200, 200', and/or 300 may be fabricated. Consequently, the benefits of the magnetic element may be achieved.

Figure 9:
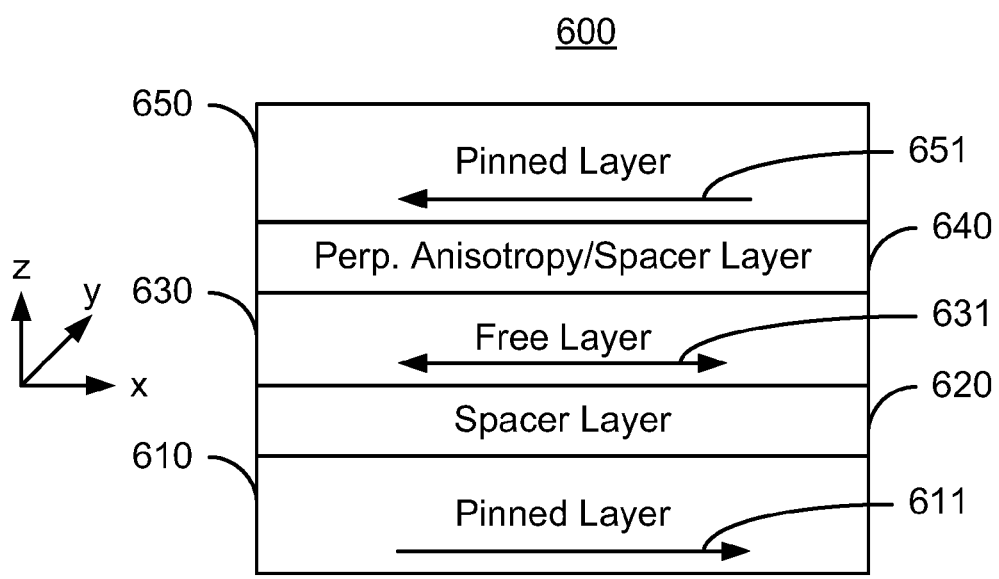
FIG. 9 depicts an exemplary of a dual magnetic element having improved thermal stability.

FIG. 9 depicts an exemplary of a dual magnetic element 600 having improved thermal stability. The magnetic element 600 is for use in a magnetic device, such as a magnetic memory, in which current is to be driven through the magnetic element 600. For example, the dual magnetic element 600 may be used in the memory 400 as magnetic element 412. Consequently, such a device may include contacts through which current would be provided to and exit from the magnetic element 600. For clarity, FIG. 9 is not drawn to scale and some portions of the magnetic element 200 might be omitted.

The magnetic element 600 includes a pinned layer 610, a spacer layer 620, free layer 630, a perpendicular spacer layer 640 and an additional pinned layer 650. The magnetic element 600 may also include seed layer(s) (not shown). In addition, the magnetic element 600 generally also includes pinning structures, such as AFM layer(s) (not shown), which are used to fix, or pin, the magnetizations 611 and 651 of the pinned layers 610 in the desired direction(s).

The pinned layers 610 and 650 and the free layer 630 are magnetic and thus may include one or more of Ni, Fe, and Co, particularly in an alloy form. The magnetizations 611 and 651 of the pinned layers 610 and 650, respectively, are fixed, or pinned, in a particular direction, typically by an exchange-bias interaction with an AFM layer (not shown). Although depicted as a simple layer with a single magnetization 611 and 651, each of the pinned layers 610 and 650, respectively may include multiple layers. For example, one or both of the pinned layers 610 and 650 may be a SAF including magnetic layers antiferromagnetically or ferromagnetically coupled through thin layers, such as Ru. In such a SAF, multiple magnetic layers interleaved with thin layer(s) of Ru or other material may be used. Although shown as aligned in opposite directions, in other embodiments, the magnetizations 611 and 651 of the pinned layers 610 and 650 may be aligned in another manner.

The spacer layer 620 is nonmagnetic. In some embodiments, the spacer layer 620 is an insulator, for example a tunneling barrier. In such embodiments, the spacer layer 620 may include crystalline MgO, which may enhance the tunneling magnetoresistance (TMR) of the magnetic element. In addition, doped MgO may also be used for the tunneling barrier layer 620. In alternate embodiments, the spacer layer 620 might have another structure, for example a conductive layer or a granular layer including conductive channels in an insulating matrix. Further, in some embodiments, the spacer layer 620 may be analogous to the perpendicular spacer layer 640, described below.

The free layer 630 has a changeable magnetization 631. Although depicted as a simple layer with a single magnetization 631, the free layer 630 may also include multiple ferromagnetic and/or nonmagnetic layers. For example, the free layer 630 may be a SAF including magnetic layers antiferromagnetically or ferromagnetically coupled through one or more thin layers, such as Ru. The free layer 630 may also be a bilayer. Similarly, the free layer 630 might be a trilayer or have another number of layers. In addition, the bilayer and/or trilayer might be repeated in the free layer 630. Other structures for the free layer 630 may also be used. For example, the free layer 630 might include multiple ferromagnetic layers interleaved with one or more capping layer. In this embodiment, the capping layer would be so termed because it resides on a ferromagnetic layer within the free layer 630. Such a capping layer might include a perpendicular capping layer analogous to, for example, the capping layer 140. A ferromagnetic layer would reside at the top and bottom edges of the free layer 630. Thus, the free layer would include at least two ferromagnetic layers with a capping layer in between.

In the embodiment shown, the free layer has an easy axis along the magnetization 631 shown. The free layer easy axis is, therefore, along the x-axis, in the plane of the free layer 630. The magnetization of the free layer 630 is stable along the easy axis, to the left or to the right in FIG. 9. Thus, the stable magnetic states are those in which the magnetization 631 of the free layer is to the left or right in FIG. 9. In other embodiments, the easy axis might be along a different direction. Further, the free layer 630 has an out-of-plane demagnetization energy and a perpendicular magnetic anisotropy corresponding to a perpendicular anisotropy energy. In the embodiment shown, the in-plane magnetic anisotropy is substantially parallel to x-y plane of FIG. 9, while the perpendicular magnetic anisotropy is substantially parallel to the z-axis. The perpendicular anisotropy energy that is less than the out-of-plane demagnetization energy for the free layer 630. As a result, the magnetization 631 of the free layer 630 is stable in-plane. The magnetic element 600 is also configured to allow the free layer 630 to be switched between stable magnetic states when a write current is passed through the magnetic element 600. Thus, in the exemplary embodiment depicted in FIG. 9, spin transfer torque may be used to switch the magnetization 631 of the free layer 630 to be parallel or antiparallel to the magnetization 611 of the pinned layer 610 and antiparallel or parallel to the magnetization 651 of the pinned layer 650, respectively.

The perpendicular spacer layer 640 is analogous to the perpendicular capping layers 140, 140', 240, 240', and 340 in that the perpendicular spacer layer 640 adjoins and induces an anisotropy in the free layer 630. In the embodiment shown, the perpendicular spacer layer 640 resides between the free layer 630 and the pinned layer 650. The perpendicular spacer layer 640 is so named because it is configured to induce at least a portion of the perpendicular magnetic anisotropy in the free layer 630 and acts as a nonmagnetic spacer between the free layer 630 and the pinned layer 650. In some embodiments, the perpendicular spacer layer 640 induces the perpendicular magnetic anisotropy substantially without changing the out-of-plane demagnetization energy or the in-plane magnetic anisotropy of the free layer 630. The perpendicular spacer layer 640 induces a component of the perpendicular magnetic anisotropy in the free layer 630 throughout use: both during operation and during latency when the magnetic element 600 is in a quiescent state. In addition, the perpendicular spacer layer 640 acts as a nonmagnetic spacer layer between the free layer 630 and the pinned layer 650. Thus, the magnetic element 800 may act as a dual magnetic tunneling junction or analogous structure. In some embodiment, the perpendicular spacer layer 640 is a tunneling barrier.

The perpendicular spacer layer 640 may contribute to the perpendicular magnetic anisotropy of the free layer 630 based on the materials selected. In some embodiments, the perpendicular spacer layer 640 is an oxide or nitride such as MgO, NiO, aluminum oxide, silicon oxide, AlN, SiN, TaN, TiN, $RuO_2$ or ITO (indium tin oxide) that is doped and/or has a stoichiometry that may reduce the layer's resistance. For example, MgO doped with Ti may be used as the perpendicular spacer layer 640. In other embodiments, the perpendicular spacer layer 640 may also include a metal such as Al, Cu, Mg, Ru, Au, Cr, Pt, Pd, Ta, W and/or V. For example, the perpendicular spacer layer 640 may have multiple layers. However, in such embodiments interdiffusion with the free layer and/or increased damping may need to be considered. In some embodiments, the perpendicular spacer layer 640 may be a multilayer. For example, the perpendicular spacer layer 640 may be a bilayer having a doped oxide or doped nitride layer adjoining the free layer 630 and a metallic layer on the oxide or nitride layer. In one such embodiment, the doped oxide layer includes doped MgO and the metallic layer includes Mg. Use of such a bilayer as the perpendicular spacer layer 640 may allow use of thinner insulators while providing effective diffusion blocking. In some embodiments of this bilayer, the metallic layer may include materials that increase the perpendicular anisotropy of the free layer via stress, such as Ru, Cu, Pt, Pd, Ta, and/or W. In some such embodiments, the additional metallic layer may include materials used to improve spin transfer torque or reduce the overall resistance of the bilayer, for example Al, Au, Mg, and/or Cr. In other embodiments, the perpendicular capping layer 140 may be a trilayer including the materials described above.

In addition to inducing a perpendicular anisotropy in the free layer 630, the perpendicular spacer layer 640 may reduce dead magnetic regions, improve the order of the interface, and reduce damping that may otherwise adversely affect performance of the free layer 630. The perpendicular spacer layer 640 may also act as a diffusion block and improve the surface quality of the free layer. Further, in some embodiments, the perpendicular spacer layer 640 may improve damping by diffusion blocking and a reduction in the spin pump effect.

The magnetic element 600 may also include other components not shown in FIG. 9. For example, in addition to seed layers, the magnetic element 600 may include AFM layers (not shown) adjoining the pinned layers 610 and 650 for pinning the magnetizations 611 and 651, respectively, of the pinned layers 610 and 650, respectively. The magnetic element 600 might include an additional free layer residing between the free layer 630 and the nonmagnetic spacer layer 620 and a perpendicular capping layer analogous to the perpendicular capping layers 140, 140', 240, 240', and 340. Such a perpendicular capping layer would reside on the additional free layer and between the additional free layer and the free layer 630. The additional capping layer may be configured such that the free layer 630 and the additional free layer (not shown) are antiferromagnetically dipole coupled.

The magnetic element 600 may have improved performance and thermal stability. The perpendicular spacer layer 640 adjoins the free layer 630 and also functions as a tunneling barrier layer. In addition, the perpendicular spacer layer 640 may function as a diffusion blocking layer, which improves the interface, reduces or eliminated dead magnetic regions of the free layer 630, and mitigates damping. Because doped materials, such as doped MgO or a bilayer/trilayer such as doped MgO/Mg are used, the resistance of the perpendicular spacer layer 640 may be reduced. This reduction in resistance may be desirable. Further, the magnetic element 600 may have improved thermal stability due to the perpendicular spacer layer 640. More specifically, the perpendicular spacer layer 640 increases the perpendicular magnetic anisotropy of the free layer 630. This increase in perpendicular magnetic anisotropy leads to a decrease in the switching current $J_{co}$, without degradation of the thermal stability. This phenomenon feature is described above with respect to the magnetic structure 100. For a given write current, therefore, the magnetic element 600 has improved thermal stability. As a result, the magnetic element 600 is less subject to thermal fluctuations and thermal stability may be increased. The magnetic element 600 may thus be more suitable for applications such as STT-RAM. In addition to limiting inter-diffusion and inducing a perpendicular anisotropy as discuss above, in some embodiments, the perpendicular spacer layer 640 may also transmit spin transfer torque between magnetic layers and allow magnetic coupling between layers. In such embodiments, additional configurations of magnetic layers and spin transfer switching may be improved.

Figure 10:
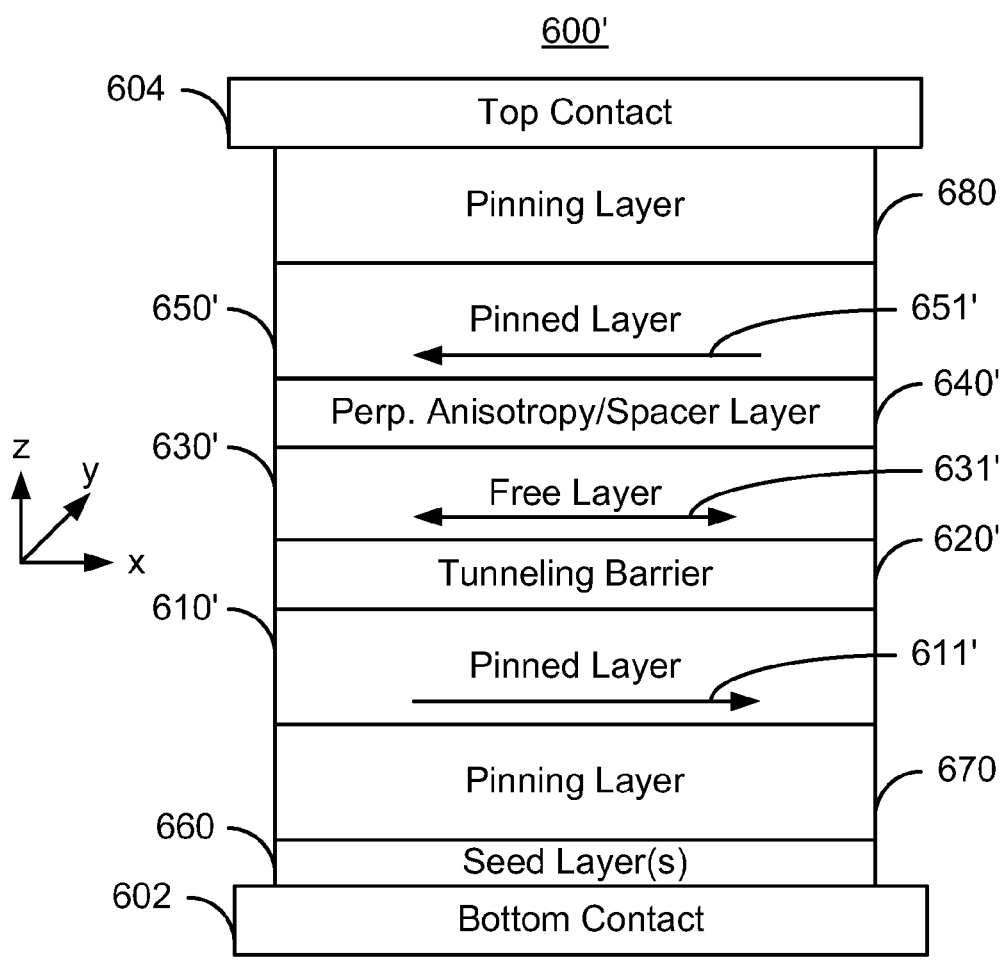
FIG. 10 depicts another exemplary of a dual magnetic element having improved thermal stability.

FIG. 10 depicts another exemplary of a magnetic element 600' having improved thermal stability. The magnetic element 600' is for use in a magnetic device, such as the magnetic memory 400, in which current is to be driven through the magnetic element 600'. Consequently, contacts 602 and 604 through which current would be provided to and exit from the magnetic element 600' are shown in FIG. 10. For clarity, FIG. 10 is not drawn to scale and some portions of the magnetic element 100' might be omitted. Further, the magnetic element 600' is analogous to the magnetic element 600 depicted in FIG. 9. Thus, the magnetic element 600' includes a pinned layer 610', a spacer layer 620', a free layer 630', a perpendicular spacer layer 640', and pinned layer 650' that are analogous to the pinned layer 610, the spacer layer 620, the free layer 630, and the perpendicular spacer layer 640, and pinning layer 650 respectively. The magnetic element 600 may also include seed layer(s) 660 and pinning layers 670 and 680. The seed layer(s) 660 are used to provide the desired surface for growth of the pinning layer 670. In some embodiments, the pinning layers 670 and 680 are AFM, such as IrMn.

The pinned layers 610' and 650' and the free layer 630' are magnetic and thus may include one or more of Ni, Fe, and Co, particularly in an alloy form. For simplicity, the pinned layers 610' and 650' are shown as having magnetizations 611' and 651', respectively. The free layer 130' is shown with magnetization/easy axis 631'. The structure and function of the pinned layers 610' and 650' and free layer 630' are analogous to that of the pinned layers 610 and 650 and free layer 6, respectively. Although shown aligned antiparallel, the magnetizations 611' and 651' may be aligned in another manner.

Thus, the pinned layers 610' and 650' and free layer 630' may be SAFs, other multilayers or have other structures. The magnetic element 600' may also include other components not shown in FIG. 10. For example, The magnetic element 600' might include an additional free layer (not shown) residing between the free layer and the nonmagnetic spacer layer and a perpendicular capping layer (not shown) residing on the additional free layer and between the additional free layer and the free layer 630'. The perpendicular capping layer may be configured such that the free layer 630' and the additional free layer are antiferromagnetically dipole coupled.

The free layer 630' has an in-plane magnetic anisotropy, an out-of-plane demagnetization energy, and a perpendicular magnetic anisotropy. The perpendicular magnetic anisotropy corresponds to a perpendicular magnetic energy. In the embodiment shown, the in-plane magnetic anisotropy is substantially parallel to x-y plane of FIG. 10, while the perpendicular magnetic anisotropy is substantially parallel to the z-axis. The out-of-plane demagnetization energy is also greater than the perpendicular anisotropy energy for the free layer 630'. As a result, the magnetization 631' of the free layer 630' is stable in-plane. The magnetic element 600' is also configured to allow the free layer 630' to be switched between stable magnetic states when a write current is passed through the magnetic element 600'. Thus, in the exemplary embodiment depicted in FIG. 10, spin transfer torque may be used to switch the magnetization 631' of the free layer 630'.

In the embodiment shown, the spacer layer 620' is a tunneling barrier layer 620'. In one such embodiment, the tunneling barrier layer 620' may include crystalline MgO, which may enhance the tunneling magnetoresistance (TMR) of the magnetic element 600'. In addition, doped MgO may also be used for the tunneling barrier layer 620'. In alternate embodiments, the spacer layer 620' might have another structure, for example a granular layer including conductive channels in an insulating matrix.

The perpendicular spacer layer 640' adjoins the free layer 630' and resides between the free layer 630' and the pinned layer 650'. The perpendicular spacer layer 640' is configured to induce at least a portion of the perpendicular magnetic anisotropy in the free layer 630'. In the embodiment shown, the perpendicular spacer layer 640' induces the perpendicular magnetic anisotropy without substantially changing the in-plane magnetic anisotropy of the free layer 630'. The perpendicular spacer layer 640' induces a component of the perpendicular magnetic anisotropy in the free layer 630' throughout use: both during operation and during latency when the magnetic element 600' is in a quiescent state. In addition, the perpendicular spacer layer 640' acts as a nonmagnetic spacer layer between the free layer 630' and the pinned layer 650'. In some embodiment, the perpendicular spacer layer 640' is a tunneling barrier.

The perpendicular spacer layer 640' may contribute to the perpendicular anisotropy of the free layer 130' based on the materials selected. These materials are analogous to those used for the perpendicular spacer layer 640. The materials used for the perpendicular spacer layer 640' may thus include doped MgO. In some embodiments, the perpendicular spacer layer 640' may be a multilayer. In one such embodiment, the perpendicular spacer layer 640' may be a bilayer having an oxide or nitride layer adjoining the free layer and a metallic layer on the oxide or nitride layer. For example, the perpendicular spacer layer 640' could include a doped MgO layer and a metallic layer such as Ru, Mg, or Cr. The perpendicular spacer layer 640' may also include a trilayer.

The magnetic element 600' shares the benefits of the magnetic element 600. The magnetic element 600' may have improved performance and thermal stability. The perpendicular spacer layer 640' is interposed between the free layer 630' and the pinned layer 650'. As a result, the perpendicular spacer layer 640' aids in improving the interface, reducing or eliminated dead magnetic regions of the free layer 630', and mitigating damping. In addition, because doped materials, such as doped MgO or a bilayer such as doped MgO/Mg are used, the resistance of the perpendicular spacer layer 640' is reduced, which may be desirable. The magnetic element 600' may have improved thermal stability due to the perpendicular spacer layer 640. More specifically, the perpendicular spacer layer 640' increases the perpendicular magnetic anisotropy of the free layer 630', which may decrease the write current required substantially without degradation of the thermal stability. As a result, the magnetic element 600' is less subject to thermal fluctuations and thermal stability may be increased. Further, as described above, a reduction in inter-diffusion, an enhanced spin torque transfer, and a desired magnetic coupling may also be achieved. The magnetic element 600' may thus be more suitable for applications such as STT-RAM.

Figure 11:
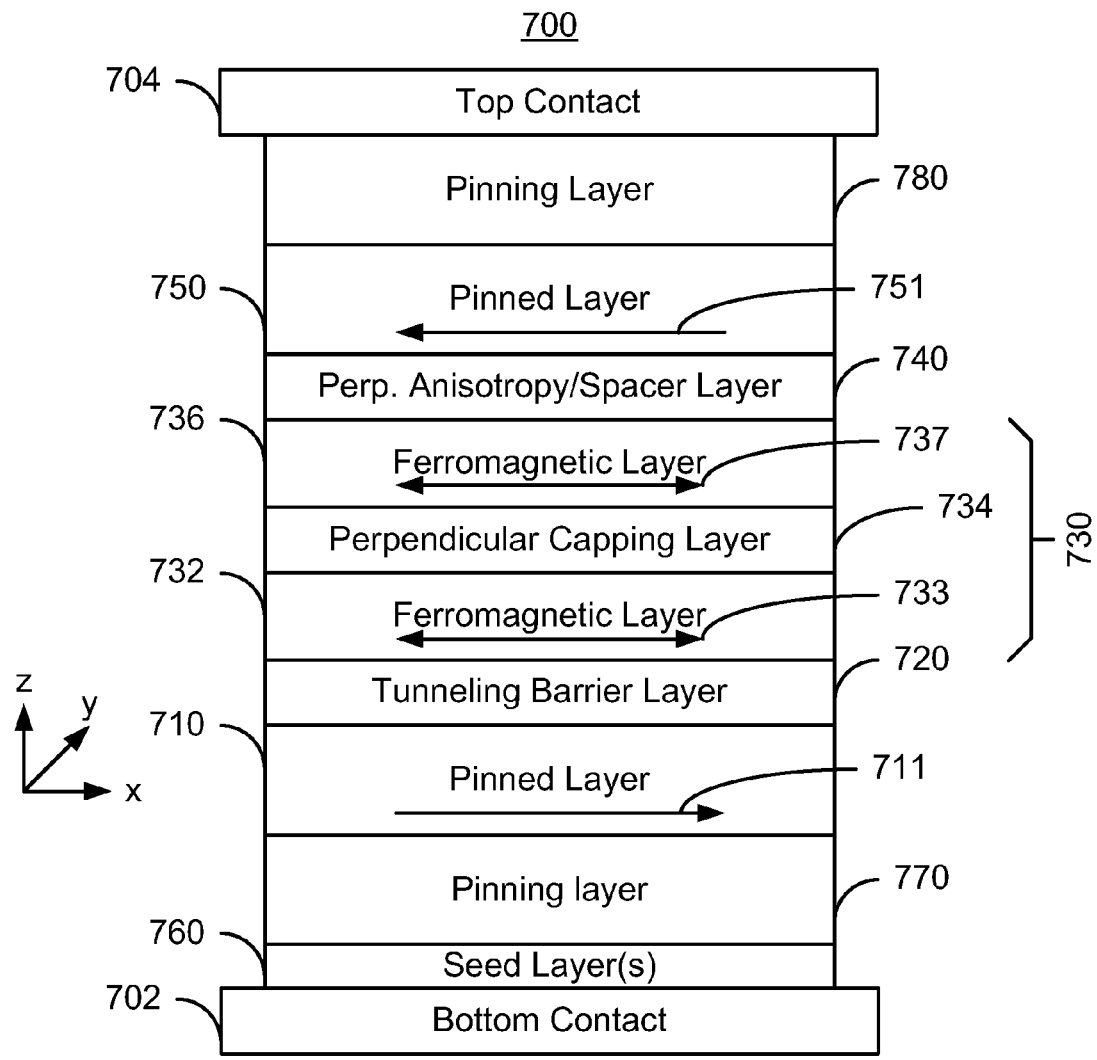
FIG. 11 depicts another exemplary embodiment of a dual magnetic element having improved thermal stability.

FIG. 11 depicts another exemplary embodiment of a magnetic element 700 having improved thermal stability. The magnetic element 700 is for use in a magnetic device, such as a magnetic memory 400, in which current is to be driven through the magnetic element 700. Consequently, contacts 702 and 707 through which current would be provided to and exit from the magnetic element 700 are shown in FIG. 11. For clarity, FIG. 11 is not drawn to scale and some portions of the magnetic element 700 might be omitted. Further, the magnetic element 700 is analogous to the magnetic elements 600/600' depicted in FIGS. 9/10. Thus, the magnetic element 700 includes seed layer(s) 760, pinning layer 770, pinned layer 710, spacer layer 720, free layer 730, perpendicular spacer layer 740, pinned layer 750, and pinning layer 780 that are analogous to the seed layer(s) 660, pinning layer 660, pinned layer 610/610', the spacer layer 620/620', the free layer 630/630', the perpendicular spacer layer 640/640', the pinned layer 650/650', and pinning layer 680, respectively. The seed layer(s) 760 are used to provide the desired surface for growth of the pinning layer 770. In some embodiments, the pinning layers 770 and 780 are AFMs, such as IrMn.

The pinned layers 710 and 750 and the free layer 730 are magnetic and thus may include one or more of Ni, Fe, and Co, particularly in an alloy form. For simplicity, the pinned layers 710 and 750 are each shown as having a magnetization 711 and 751, respectively. Although shown aligned antiparallel, the magnetizations 711 and 751 may have a different orientation. The structure and function of the seed layer(s) 750, pinning layers 760 and 780, and pinned layer 710 and 750 are analogous to that of the seed layer(s) 650, pinning layers 660 and 680, and pinned layers 610/610 and 650/650", respectively. Thus, the pinned layers 710 and 750 may be a SAF, other multilayers or have other structures. The magnetic element 700 may also include other components not shown in FIG. 11.

The free layer 730 includes ferromagnetic layers 732 and 736 and capping layer 734. The ferromagnetic layers 732 and 736 have magnetizations 733 and 737, respectively. In the embodiment shown, the perpendicular capping layer 734 is configured such that the magnetizations 733 and 737 of the ferromagnetic layers 732 and 736, respectively, are ferromagnetically coupled. However, magnetizations 733 and 737 of the layers 732 and 734 may be aligned parallel, antiparallel, or in another manner. In some embodiments, the perpendicular capping layer 734 may also affect the perpendicular anisotropy of the ferromagnetic layers 732 and 736 in a way that is similar to the perpendicular capping layers 140, 140', and 240, and perpendicular spacer layers 640, 640' described above. Thus, the materials used for the perpendicular capping layer 734 may include one or more of MgO, doped MgO, NiO, aluminum oxide, silicon oxide, AlN, SiN, TaN, TiN, $RuO_2$, ITO, Al, Cu, Mg, Ru, Au, Cr, Pt, Pd, Ta, W and/or V. In this embodiment the perpendicular capping layer 734 is understood to be thin enough to allow either orange-peel ferromagnetic coupling or to mediate ferromagnetic exchange coupling between ferromagnetic layers 732 and 736. In alternate embodiments, another nonmagnetic spacer layer may be used in lieu of perpendicular capping layer 734.

The ferromagnetic layers 732 and 736 of the free layer 730 also have an in-plane magnetic anisotropy, an out-of-plane demagnetization energy, and a perpendicular magnetic anisotropy corresponding to a perpendicular anisotropy energy. In the embodiment shown, the in-plane magnetic anisotropy is substantially parallel to x-y plane of FIG. 11, while the perpendicular magnetic anisotropy is substantially parallel to the z-axis. The out-of-plane demagnetization energy is also greater than the perpendicular anisotropy energy for the ferromagnetic layers 732 and 736 of the free layer 730. As a result, the magnetizations 731 and 737 of the free layer 230 are stable in-plane. The magnetic element 700 is also configured to allow the free layer 730 to be switched between stable magnetic states when a write current is passed through the magnetic element 700. Thus, in the exemplary embodiment depicted in FIG. 11, spin transfer torque may be used to switch the magnetizations 731 and 737 of the free layer 730.

In the embodiment shown, the spacer layer 720 is a tunneling barrier layer 220. In one such embodiment, the tunneling barrier layer 720 may include crystalline MgO, which may enhance the tunneling magnetoresistance (TMR) of the magnetic element 700. In addition, doped MgO may also be used for the tunneling barrier layer 720. In alternate embodiments, the spacer layer 720 might have another structure, for example a granular layer including conductive channels in an insulating matrix or even a conductive layer.

The perpendicular spacer layer 740 adjoins the ferromagnetic layer 736 of the free layer 730. The perpendicular spacer layer 7 is configured to induce at least a portion of the perpendicular magnetic anisotropy in ferromagnetic layer 736 of the free layer 730. In the embodiment shown, the perpendicular spacer layer 740 induces the perpendicular magnetic anisotropy substantially without changing the in-plane magnetic anisotropy of the ferromagnetic layer 736 of the free layer 730. The perpendicular spacer layer 740 induces a component of the perpendicular magnetic anisotropy in the ferromagnetic layer 736 throughout use: both during operation and during latency when the magnetic element 700 is in a quiescent state. In addition, the perpendicular spacer layer 740 acts as a nonmagnetic spacer layer between the pinned layer 750 and the ferromagnetic layer 736 of the free layer 730. In some embodiments, therefore, the perpendicular spacer layer 740 may also function as a tunneling barrier layer. Thus, the perpendicular spacer layer 740 may have an analogous structure and function to the perpendicular spacer layers 640 and 640'.

The magnetic element 700 shares the benefits of the magnetic elements 600/600'. The magnetic element 700 may have improved performance and thermal stability. The perpendicular spacer layer 740 may aid in improving the interface, reducing or eliminated dead magnetic regions of the ferromagnetic layer 736 of the free layer 730, and mitigating damping. In addition, the use of doped materials such as doped MgO or a multilayer such as a doped MgO/Mg bilayer reduces the resistance of the perpendicular spacer layer 740, which may be desirable. Further, the magnetic element 700 may have improved thermal stability due to the perpendicular spacer layer 740. More specifically, the perpendicular capping layer 740 increases the perpendicular magnetic anisotropy of the ferromagnetic layer 736, which may decrease the write current required substantially without degradation of the thermal stability. Because they are ferromagnetically coupled, the ferromagnetic layer 732 and the ferromagnetic layer 736 tend to switch together. Thus, the switching current of the free layer 730 may be reduced substantially without adversely affecting the thermal stability of the free layer 730. As a result, the magnetic element 700 may be less subject to thermal fluctuations and thermal stability may be increased. Further, as described above, a reduction in inter-diffusion, spin transfer torque transmission, and desired magnetic coupling may also be achieved between the layers 732 and 736. The magnetic element 700 may thus be more suitable for applications such as STT-RAM.

Figure 12:
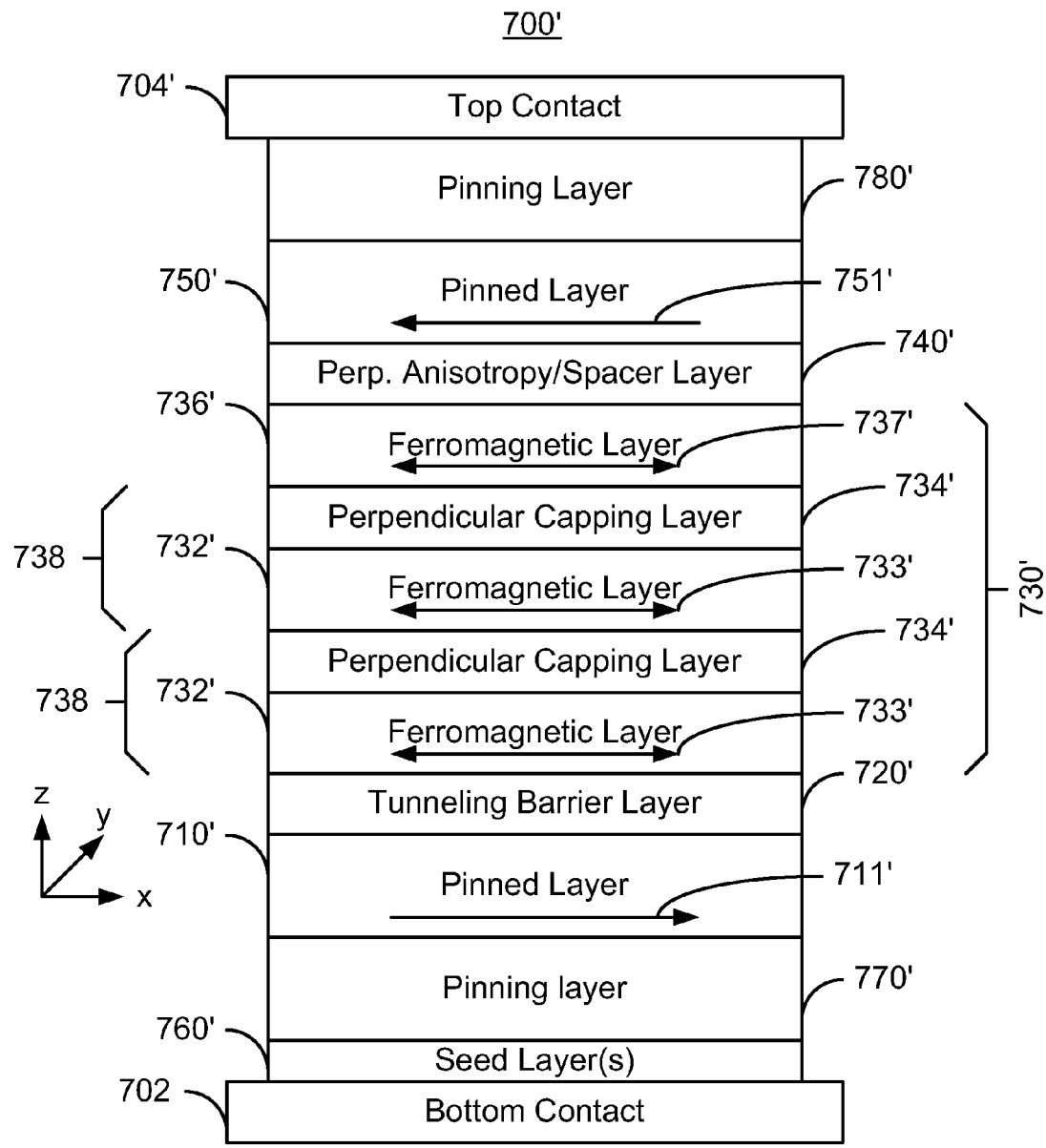
FIG. 12 depicts another exemplary embodiment of a dual magnetic element having improved thermal stability.

FIG. 12 depicts another exemplary embodiment of a magnetic element 700' having improved thermal stability. The magnetic element 700' is for use in a magnetic device, such as a magnetic memory, in which current is to be driven through the magnetic element 700'. Consequently, contacts 702' and 704' through which current would be provided to and exit from the magnetic element 700' are shown in FIG. 12. For clarity, FIG. 12 is not drawn to scale and some portions of the magnetic element 700' might be omitted. Further, the magnetic element 700' is analogous to the magnetic elements 600/600'/700 depicted in FIGS. 9-11. Thus, the magnetic element 700' includes seed layer(s) 760', pinning layer 770', pinned layer 710', spacer layer 720', free layer 730', perpendicular capping spacer 740', pinned layer 750', and pinning layer 780' that are analogous to the seed layer(s) 660/760, pinning layer 670/770, pinned layer 610/610'/710, the spacer layer 620/620'/720, the free layer 630/630'/730, the perpendicular spacer layer 640/640'/740, pinned layer 650/650'/750, and pinning layer 680/780, respectively.

The magnetic element 700' is essentially identical to the magnetic element 700. However, the free layer 730' includes multiple repeats of the ferromagnetic layer 732 and perpendicular capping layer 734 shown in FIG. 11. Referring back to FIG. 5, two repeats of the bilayer 738 are shown. Each bilayer 738 includes a ferromagnetic layer 732' and a perpendicular capping layer 734'. The two ferromagnetic layers 732' and the ferromagnetic layer 736' are all ferromagnetically coupled. However, the magnetizations 733' and 737' of the layers 732' and 734' may be aligned parallel or antiparallel. In one embodiment, the magnetizations 733 and 737 are aligned parallel. Although two repeats of the bilayer 738 are shown in FIG. 12, another number of repeats might be provided. The perpendicular capping layer 734' may also increase the perpendicular anisotropy of ferromagnetic layer 732' in a manner analogous to the capping layer 734. However, in other embodiments, the perpendicular capping layer 734' may be replaced by another nonmagnetic spacer layer.

The magnetic element 700' shares the benefits of the magnetic elements 600/600'/700. The magnetic element 700' may have improved performance and thermal stability. The perpendicular cap layer 740' may aid in improving the interface, reducing or eliminated dead magnetic regions of the ferromagnetic layer 736', and mitigating damping. The use of doped materials, such as doped MgO or a multilayer such as doped MgO/Mg reduces the resistance of the perpendicular capping layer 740', which may be desirable. Further, the magnetic element 700' may have improved thermal stability due to the perpendicular capping layer 740' as described above. As a result, the magnetic element 700' may be less subject to thermal fluctuations and thermal stability may be increased. The magnetic element 700' may thus be more suitable for applications such as STT-RAM.

Figure 13:
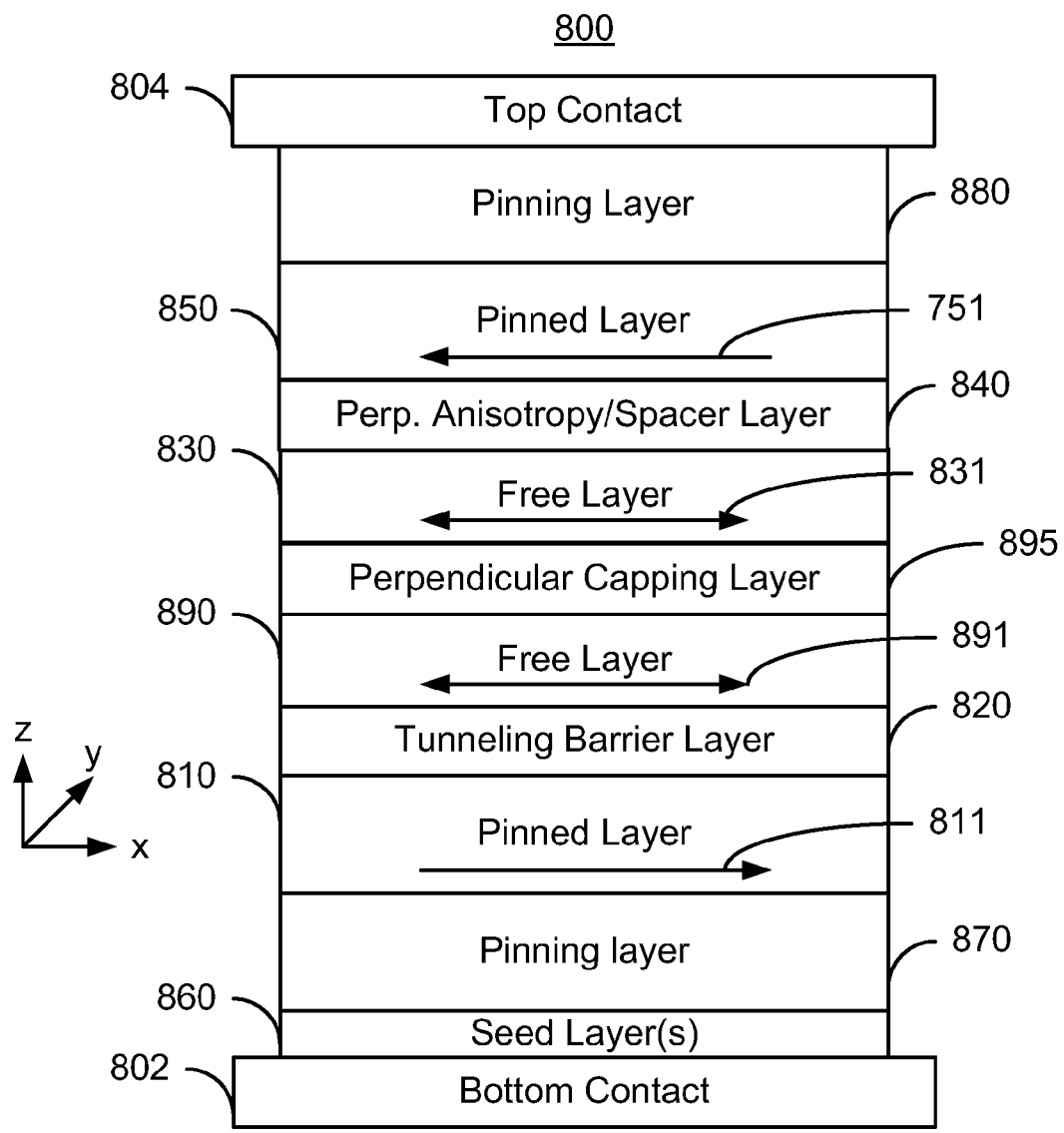
FIG. 13 depicts another exemplary embodiment of a dual magnetic element having improved thermal stability.

FIG. 13 depicts another exemplary embodiment of a magnetic element 800 having improved thermal stability. The magnetic element 800 is for use in a magnetic device, such as the magnetic memory 400, in which current is to be driven through the magnetic element 800. Consequently, contacts 802 and 804 through which current would be provided to and exit from the magnetic element 800 are shown in FIG. 13. For clarity, FIG. 13 is not drawn to scale and some portions of the magnetic element 800 might be omitted. Further, the magnetic element 800 is analogous to the magnetic elements 600/600'/700/700' depicted in FIGS. 9-12. Thus, the magnetic element 800 includes seed layer(s) 860, pinning layer 870, pinned layer 810, tunneling barrier layer 820, free layer 830, perpendicular spacer layer 840, pinned layer 850, and pinning layer 880 that are analogous to the seed layer(s) 660/760/760', pinning layer 660/760/760', pinned layer 610/610'/710/710', spacer layer 620/620'/720/720', free layer 630/630'/730/730', perpendicular spacer layer 640/640'/740/740', pinned layer 650/650'/750/750', and pinning layer 680/780/7680', respectively. The seed layer(s) 860 are used to provide the desired surface for growth of the pinning layer 870. In some embodiments, the pinning layers 870 and 880 include an AFM, such as IrMn.

The pinned layers 810 and 880 and the free layer 830 are magnetic and thus may include one or more of Ni, Fe, and Co, particularly in an alloy form. For simplicity, the pinned layers 810 and 850 are shown as having magnetizations 811 and 851, respectively. Although depicted as being aligned antiparallel, in alternate embodiments, the magnetizations 811 and 851 may have a different orientation. The structure and function of the seed layer(s) 860, pinning layers 870 and 880, and pinned layers 810 and 850 are analogous to that of the seed layer(s) 660/760/760', pinning layers 660/760/760' and 680/780/780', and pinned layers 610/610'/710/710' and 650/650'/750/750', respectively. Thus, the pinned layers 810 and 850 may be a SAF, other multilayers or have other structures. The magnetic element 800 may also include other components not shown in FIG. 13.

In the embodiment shown, the spacer layer 820 is a tunneling barrier layer 820. In one such embodiment, the tunneling barrier layer 820 may include crystalline MgO, which may enhance the tunneling magnetoresistance (TMR) of the magnetic element 800. In addition, doped MgO may also be used for the tunneling barrier layer 820. In alternate embodiments, the spacer layer 820 might have another structure, for example a granular layer including conductive channels in an insulating matrix.

The free layer 830 is analogous to the free layers 630/630'/730/730'. Although shown as a simple (single) layer, the free layer 830 may include multiple layers. For example, the free layer 830 may be analogous to the free layers 730/730', including multiple ferromagnetically coupled ferromagnetic layers. The free layer 820 is, however, magnetically coupled with the free layer 890, described below.

The magnetic element 800 includes an additional free layer 890 depicted as having magnetization 891 and a perpendicular capping layer 895. The additional free layer 890 lies between the free layer 830 and the tunneling barrier layer 820. Although shown as a simple layer, the additional free layer 890 may include multiple layers, for example a SAF including multiple ferromagnetic layers (not shown) interleaved with nonmagnetic layers (not shown). The ferromagnetic layers might be ferromagnetically coupled or antiferromagnetically aligned. The perpendicular capping layer 895 resides on the additional free layer 890 and between the additional free layer 890 and the free layer 830. In alternate embodiments, the perpendicular capping layer 895 may be replaced by a nonmagnetic layer. The perpendicular capping layer 895 is configured such that the magnetization 831 of the free layer 830 and the magnetization 891 of the additional free layer 890 are magnetically coupled. In the embodiment shown, the magnetizations 831 and 891 are antiferromagnetically dipole coupled. Further, the capping layer 895 may affect the perpendicular anisotropy of the ferromagnetic layers 890 and 830 in a way that is similar to the perpendicular capping layers 140, 140', 240, 240', 340, and 380. The materials used for the perpendicular capping layer 895 may thus include one or more of MgO, doped MgO, NiO, aluminum oxide, silicon oxide, AlN, SiN, TaN, TiN, $RuO_2$, ITO, Al, Cu, Mg, Ru, Au, Cr, Pt, Pd, Ta, W and/or V. In one such embodiment the perpendicular capping layer 895 is thin enough to allow significant antiferromagnetic dipole coupling between ferromagnetic layers 890 and 830.

The free layers 830 and 890 also have an in-plane magnetic anisotropy, an out-of-plane demagnetization energy and a perpendicular magnetic anisotropy corresponding to a perpendicular anisotropy energy. In the embodiment shown, the in-plane magnetic anisotropy is substantially parallel to x-y plane of FIG. 13, while the perpendicular magnetic anisotropy is substantially parallel to the z-axis. The out-of-plane demagnetization energy is also greater than the perpendicular anisotropy energy for the free layers 830 and 890. As a result, the magnetizations 831 and 891 of the free layers 830 and 890 are stable in-plane. The magnetic element 800 is also configured to allow the free layers 830 and 890 to be switched between stable magnetic states when a write current is passed through the magnetic element 800. Thus, in the exemplary embodiment depicted in FIG. 13, spin transfer torque may be used to switch the magnetizations 831 and 891 of the free layers 830 and 890.

The perpendicular spacer layer 840 adjoins the free layer 830 and is configured to induce at least a portion of the perpendicular magnetic anisotropy in the free layer 830. In the embodiment shown, the perpendicular spacer layer 840 induces the perpendicular magnetic anisotropy substantially without changing the in-plane magnetic anisotropy of the free layer 830. The perpendicular capping layer 840 induces a component of the perpendicular magnetic anisotropy in the free layer 830 throughout use: both during operation and during latency when the magnetic element 800 is in a quiescent state. The perpendicular capping layer 840 also acts as a nonmagnetic spacer layer between the free layer 830 and the pinned layer 850.

The perpendicular spacer layer 840 may contribute to the perpendicular anisotropy of the free layer 830 based on the materials selected. These materials are analogous to those used for the perpendicular capping layer 640/640'/740/740'. The materials used for the perpendicular capping layer 340 may thus include a doped oxide, such as doped MgO, and/or a doped nitride. In some embodiments, the perpendicular spacer layer 840 may be a multilayer. In one such embodiment, the perpendicular spacer layer 840 may be a bilayer having a doped oxide or doped nitride layer adjoining the free layer 830 and a metallic layer on the doped oxide or doped nitride layer. For example, the perpendicular capping layer 340 could include a doped MgO layer and a metallic layer such as Ru, Mg, or Cr. As discussed above with respect to the perpendicular capping layers 640/640'/740/740', the perpendicular capping layer 840 may also reduce dead magnetic regions, improve the order of the interface, and reduce damping that may otherwise adversely affect performance of the free layer 830. The perpendicular spacer layer 840 may also be a trilayer including the materials described above.

The magnetic element 800 shares the benefits of the magnetic elements 600/600'/700/700'. The magnetic element 800 may have improved performance and thermal stability. The perpendicular spacer layer 840 may aid in improving the interface, reducing or eliminated dead magnetic regions of the free layer 830, and mitigating damping. In addition, doped MgO or a multilayer such as doped MgO/Mg bilayer reduces the resistance of the perpendicular spacer layer 840, which may be desirable. Further, the magnetic element 800 may have improved thermal stability due to the perpendicular spacer layer 840. Because they are antiferromagnetically coupled, the free layer 830 and the free layer 890 tend to switch together. Thus, the switching current of the free layers 830 and thus 890 may be reduced substantially without adversely affecting the thermal stability of the free layer 830. This effect may be further improved if the perpendicular capping layer 895 is used. As a result, the magnetic element 800 is less subject to thermal fluctuations and thermal stability may be increased. The magnetic element 800 may thus be more suitable for applications such as STT-RAM.

Figure 14:
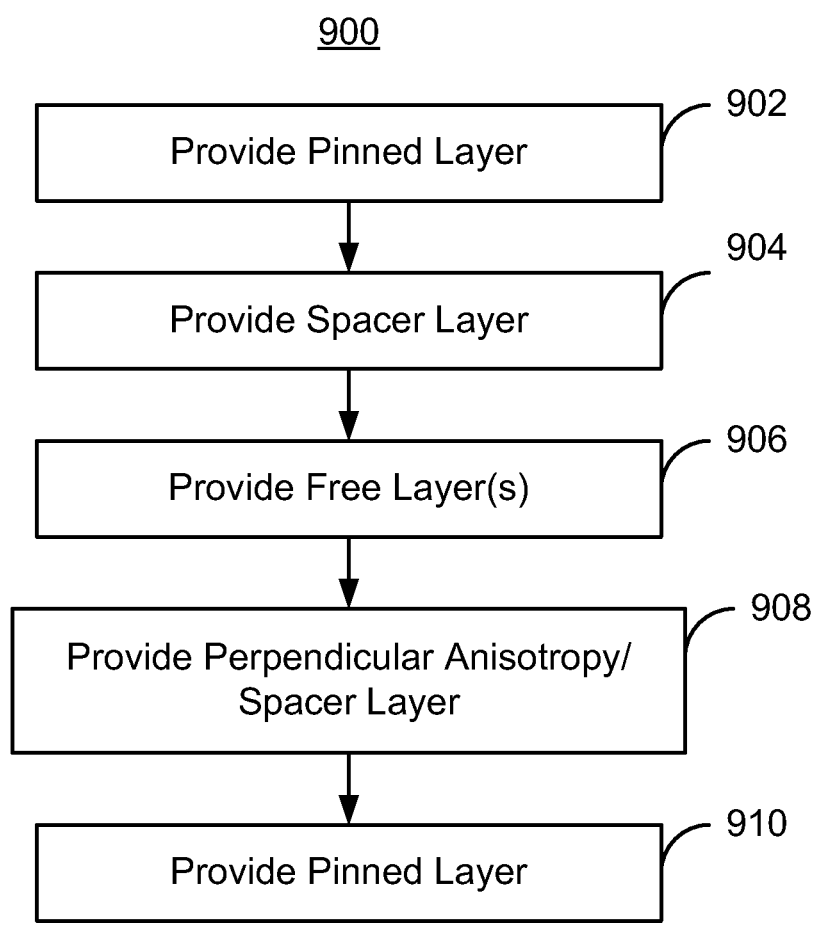
FIG. 14 depicts an exemplary embodiment of a method for fabricating a dual magnetic element having improved thermal stability.

FIG. 14 depicts an exemplary embodiment of a method 900 for fabricating a dual magnetic element having improved thermal stability. The method 900 is described in the context of the magnetic element 600. However, the method 900 may be used for other magnetic elements including but not limited to the magnetic elements 600', 700, 700', and 800. A pinned layer 610 is provided, via step 902. The spacer layer 620 is provided, via step 904. The free layer 630 is provided, via step 606. In one embodiment, step 606 includes depositing multiple layers, such as for the free layers 700 and 700'. In other embodiments, step 906 may be used to provide multiple free layers 830 and 890 having layers such as capping layer 895 therebetween. The free layer 630 has an in-plane magnetic anisotropy, an out-of-plane demagnetization energy and a perpendicular magnetic anisotropy that corresponds to a perpendicular anisotropy energy. The out-of-plane demagnetization energy is greater than the perpendicular anisotropy energy.

The method 900 also includes providing the perpendicular spacer layer 640, via step 908. The perpendicular spacer layer 640 adjoins the free layer 630 and resides between the free layer 630 and the pinned layer 650. The perpendicular capping layer 640 induces at least a portion of the perpendicular magnetic anisotropy in the free layer 630. An additional pinned layer 650 is also provided, via step 910. The magnetic element 600 is also configured to allow the free layer 130 to be switched between a plurality of stable magnetic states when a write current is passed through the magnetic element 600. Using the method 900, the magnetic element 600, 600', 700, 700', and/or 800 may be fabricated. Consequently, the benefits of the magnetic element may be achieved.

A method and system for providing a magnetic memory element and memory fabricated using the magnetic memory element has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic element for use in a magnetic device including a contact electrically coupled to the magnetic element, the magnetic element comprising:

a first pinned layer;

a nonmagnetic spacer layer;

a free layer having an out-of-plane demagnetization energy and a perpendicular magnetic anisotropy corresponding to a perpendicular anisotropy energy that is less than the out-of-plane demagnetization energy, the nonmagnetic spacer layer residing between the first pinned layer and the free layer, wherein the free layer includes a plurality of ferromagnetic layers and at least one capping layer, the plurality of ferromagnetic layers being interleaved with, sharing interfaces with and sandwiching the at least one capping layer such that a ferromagnetic layer of the plurality of ferromagnetic layers resides at an edge of the free layer, each of the at least one capping layer being configured such that the plurality of ferromagnetic layers are ferromagnetically coupled, the at least one capping layer consisting of at least one material selected from MgO, doped MgO, NiO, aluminum oxide, silicon oxide, AlN, SiN, TaN, TiN, indium tin oxide, Mg, W and V; and a perpendicular spacer layer adjoining and sharing an interface with the free layer, the free layer residing between the perpendicular spacer layer and the nonmagnetic spacer layer, the perpendicular spacer layer inducing at least a portion of the perpendicular magnetic anisotropy in the free layer and being nonmagnetic, the perpendicular spacer layer including at least one of a doped nitride layer and a doped oxide layer;

a second pinned layer, the perpendicular spacer layer residing between the free layer and the second pinned layer;

wherein the magnetic element is configured to allow the free layer to be switched between a plurality of stable magnetic states when a write current is passed through the magnetic element.

2. The magnetic element of claim 1 wherein the nonmagnetic spacer layer is a tunneling barrier layer.

3. The magnetic element of claim 2 wherein the perpendicular spacer layer is configured to induce the at least a portion of the perpendicular magnetic anisotropy without substantially changing an in-plane magnetic anisotropy of the free layer.

4. The magnetic element of claim 3 wherein the at least one capping layer further includes Ti-doped MgO.

5. The magnetic element of claim 3 wherein the at least one capping layer is a multilayer.

6. The magnetic element of claim 5 wherein the multilayer includes a first layer and a second layer, the first layer including doped MgO and the second layer consists of at least one of Ru, Mg, Cr, W, and V.

7. The magnetic element of claim 5 wherein the perpendicular spacer layer further includes doped MgO.

8. The magnetic element of claim 2 wherein the pinned layer includes a plurality of layers.

9. The magnetic element of claim 2 further comprising:

an additional free layer residing between the free layer and the nonmagnetic spacer layer; and a perpendicular capping layer residing on the additional free layer and between the additional free layer and the free layer, the perpendicular capping layer being configured such that the free layer and the additional free layer are antiferromagnetically dipole coupled.

10. The magnetic element of claim 1 wherein the at least one capping layer consists of the at least one material selected from MgO, doped MgO, NiO, aluminum oxide, silicon oxide, AlN, SiN, TaN, TiN, indium tin oxide, Mg, Cr, W and V.

11. A magnetic element for use in a magnetic device including a contact electrically coupled to the magnetic element, the magnetic element comprising:
a first pinned layer;
a tunneling barrier layer including crystalline MgO;
a free layer having an out-of-plane demagnetization energy and a perpendicular magnetic anisotropy corresponding to a perpendicular anisotropy energy that is less than the out-of-plane demagnetization energy, the tunneling barrier layer residing between the first pinned layer and the free layer, the free layer further including a plurality of ferromagnetic layers and at least one capping layer, the plurality of ferromagnetic layers being interleaved with, sharing interfaces with, and sandwiching the at least one capping layer such that a ferromagnetic layer of the plurality of ferromagnetic layers resides at an edge of the free layer, each of the at least one capping layer being configured such that the plurality of ferromagnetic layers are ferromagnetically coupled, the at least one capping layer consisting of at least one material selected from MgO, doped MgO, NiO, aluminum oxide, silicon oxide, AlN, SiN, TaN, TiN, indium tin oxide, Mg, W and V;
a perpendicular spacer layer adjoining and sharing an interface with the free layer, the free layer residing between the perpendicular spacer layer and the nonmagnetic spacer layer, the perpendicular spacer layer inducing at least a portion of the perpendicular magnetic anisotropy substantially without changing the in-plane anisotropy, the free layer and being nonmagnetic, the perpendicular spacer layer including doped crystalline MgO;
a second pinned layer, the perpendicular spacer layer residing between the free layer and the second pinned layer;
wherein the magnetic element is configured to allow the free layer to be switched between a plurality of stable magnetic states when a write current is passed through the magnetic element.

12. The magnetic element of claim 11 further comprising:
an additional free layer residing between the free layer and the tunneling barrier layer; and
a perpendicular capping layer residing on the additional free layer and between the additional free layer and the free layer, the perpendicular capping layer being configured such that the free layer and the additional free layer are antiferromagnetically dipole coupled.

13. The magnetic element of claim 11 wherein the at least one capping layer consists of the at least one material selected from MgO, doped MgO, NiO, aluminum oxide, silicon oxide, AlN, SiN, TaN, TiN, indium tin oxide, Mg, Cr, W and V.

14. A magnetic memory comprising:
a plurality of magnetic storage cells, each of the plurality of magnetic storage cells including a plurality of contacts and at least one magnetic element, each of the at least one magnetic element including a first pinned layer, a free layer, a nonmagnetic spacer layer between the first pinned layer and the free layer, a perpendicular spacer layer, and a second pinned layer, the perpendicular spacer layer residing between the free layer and the second pinned layer, the perpendicular spacer layer including at least one of a doped nitride layer and a doped oxide layer, the free layer having an out-of-plane demagnetization energy and a perpendicular magnetic anisotropy, the out-of-plane demagnetization energy being greater than the perpendicular anisotropy energy, the nonmagnetic spacer layer residing between the pinned layer and the free layer, the perpendicular spacer layer adjoining the free layer and inducing at least a portion of the perpendicular magnetic anisotropy in the free layer, the magnetic element being configured to allow the free layer to be switched between a plurality of stable magnetic states when a write current is passed through the magnetic element by the contacts, the free layer including a plurality of ferromagnetic layers and at least one capping layer, the plurality of ferromagnetic layers being interleaved with, sharing interfaces with and sandwiching the at least one capping layer such that a ferromagnetic layer of the plurality of ferromagnetic layers resides at an edge of the free layer, each of the at least one capping layer being configured such that the plurality of ferromagnetic layers are ferromagnetically coupled, the at least one capping layer consisting of at least one material selected from MgO, doped MgO, NiO, aluminum oxide, silicon oxide, AlN, SiN, TaN, TiN, indium tin oxide, Mg, W and V;
a plurality of word lines coupled with the plurality of magnetic storage cells; and
a plurality of bit lines coupled with the plurality of storage cells.

15. The magnetic memory of claim 14 wherein the spacer layer is a tunneling barrier layer.

16. The magnetic memory of claim 15 wherein the perpendicular spacer layer induces the at least a portion of the perpendicular magnetic anisotropy substantially without changing an in-plane magnetic anisotropy of the free layer.

17. The magnetic memory of claim 16 wherein the pinned layer includes a plurality of layers.

18. The magnetic memory of claim 15 wherein each of the plurality of magnetic elements further includes:
an additional free layer residing between the free layer and the nonmagnetic spacer layer; and
a perpendicular capping layer residing on the additional free layer and between the additional free layer and the free layer, the perpendicular capping layer being configured such that the free layer and the additional free layer are antiferromagnetically dipole coupled.

19. The magnetic memory of claim 14 wherein the at least one capping layer consists of the at least one material selected from MgO, doped MgO, NiO, aluminum oxide, silicon oxide, AlN, SiN, TaN, TiN, indium tin oxide, Mg, Cr, W and V.

20. A method for fabricating a magnetic element for use in a magnetic device including a contact electrically coupled to the magnetic element, the method comprising:
providing a first pinned layer;
providing a nonmagnetic spacer layer;
providing a free layer having an out-of-plane demagnetization energy and a perpendicular magnetic anisotropy corresponding to a perpendicular anisotropy energy, the out-of-plane demagnetization energy being greater than the perpendicular anisotropy energy, the nonmagnetic spacer layer residing between the pinned layer and the free layer, the free layer including a plurality of ferromagnetic layers and at least one capping layer, the plurality of ferromagnetic layers being interleaved with, sharing interfaces with and sandwiching the at least one capping layer such that a ferromagnetic layer of the plurality of ferromagnetic layers resides at an edge of the free layer, each of the at least one capping layer being configured such that the plurality of ferromagnetic layers are ferromagnetically coupled, the at least one capping layer consisting of at least one material selected from MgO, doped MgO, NiO, aluminum oxide, silicon oxide, AlN, SiN, TaN, TiN, indium tin oxide, Mg, W and V; and providing a perpendicular spacer layer adjoining and sharing an interface with the free layer, the perpendicular spacer layer inducing at least a portion of the perpendicular magnetic anisotropy in the free layer and including at least one of a doped nitride and doped MgO;

wherein the magnetic element is configured to allow the free layer to be switched between a plurality of stable magnetic states when a write current is passed through the magnetic element.

* * * * *